US009000655B2

(12) United States Patent
Tanaka et al.

(10) Patent No.: US 9,000,655 B2
(45) Date of Patent: Apr. 7, 2015

(54) PIEZOELECTRIC FILM, INK JET HEAD, METHOD OF FORMING IMAGE BY THE INK JET HEAD, ANGULAR VELOCITY SENSOR, METHOD OF MEASURING ANGULAR VELOCITY BY THE ANGULAR VELOCITY SENSOR, PIEZOELECTRIC GENERATING ELEMENT, AND METHOD OF GENERATING ELECTRIC POWER USING THE PIEZOELECTRIC GENERATING ELEMENT

(71) Applicants: Yoshiaki Tanaka, Nara (JP); Takakiyo Harigai, Osaka (JP); Hideaki Adachi, Osaka (JP); Eiji Fujii, Osaka (JP)

(72) Inventors: Yoshiaki Tanaka, Nara (JP); Takakiyo Harigai, Osaka (JP); Hideaki Adachi, Osaka (JP); Eiji Fujii, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 30 days.

(21) Appl. No.: 13/926,794

(22) Filed: Jun. 25, 2013

(65) Prior Publication Data
US 2013/0328974 A1 Dec. 12, 2013

Related U.S. Application Data

(63) Continuation of application No. PCT/JP2013/000145, filed on Jan. 16, 2013.

(30) Foreign Application Priority Data

Feb. 3, 2012 (JP) .................. 2012-021424
Mar. 5, 2012 (JP) .................. 2012-047637
Mar. 6, 2012 (JP) .................. 2012-048761
Mar. 7, 2012 (JP) .................. 2012-050053

(51) Int. Cl.
*H01L 41/18* (2006.01)
(Continued)

(52) U.S. Cl.
CPC . *H02N 2/18* (2013.01); *B41J 2/045* (2013.01);
(Continued)

(58) Field of Classification Search
USPC ......... 310/358, 357, 311, 339, 364, 365, 366; 252/62.9 PZ, 62.9 R; 501/41, 46, 16, 49; 347/68.7, 71
See application file for complete search history.

(56) References Cited

U.S. PATENT DOCUMENTS 6,638,894 B1 * 10/2003 Batlogg et al. ................ 505/126
(Continued)

FOREIGN PATENT DOCUMENTS

CN 101981718 A 2/2011
(Continued)

OTHER PUBLICATIONS

Zhou, C., et al.: "Structure and electrical properties of Bi0.5Na0.5TiO3-Bi0.5K0.5TiO3-BiCoO3 lead-free piezoelecric ceramics", Journal of Materials Science 44, 2009, pp. 3833-3840.
(Continued)

*Primary Examiner* — Thomas Dougherty
*Assistant Examiner* — Karen B Addison
(74) *Attorney, Agent, or Firm* — McDermott Will & Emery LLP

(57) ABSTRACT

The present invention provides a non-lead piezoelectric film having high crystalline orientation, the low dielectric loss, the high polarization-disappear temperature, the high piezoelectric constant, and the high linearity between an applied electric field and an amount of displacement. The present invention is a piezoelectric film comprising: a $Na_xLa_{1-x+y}Ni_{1-y}O_{3-x}$ layer having only an (001) orientation and a $(1-\alpha)$ (Bi, Na, Ba) $TiO_3$-$\alpha BiQO_3$ layer having only an (001) orientation. The $(1-\alpha)$ (Bi, Na, Ba) $TiO_3$-$\alpha BiQO_3$ layer is formed on the $Na_xLa_{1-x+y}Ni_{1-y}O_{3-x}$ layer. The character of Q represents Fe, Co, $Zn_{0.5}Ti_{0.5}$, or $Mg_{0.5}Ti_{0.5}$ The character of x represents a value of not less than 0.01 and not more than 0.05. The character of y represents a value of not less than 0.05 and not more than 0.20. The character of α represents a value of not less than 0.20 and not more than 0.50.

21 Claims, 23 Drawing Sheets

(51) Int. Cl.
*H02N 2/18* (2006.01)
*B41J 2/045* (2006.01)
*B41J 2/055* (2006.01)
*C04B 35/462* (2006.01)
*G01C 19/5628* (2012.01)
*H01L 41/09* (2006.01)
*H01L 41/113* (2006.01)
*H01L 41/187* (2006.01)
*H01L 41/316* (2013.01)
*B41J 2/14* (2006.01)
*C23C 14/08* (2006.01)
*G01C 19/56* (2012.01)
*G01C 19/5607* (2012.01)
*C23C 14/34* (2006.01)
*C30B 23/02* (2006.01)
*C30B 29/22* (2006.01)
*B32B 18/00* (2006.01)
*C04B 35/468* (2006.01)
*C04B 35/475* (2006.01)
*C04B 35/50* (2006.01)

(52) U.S. Cl.
CPC .............. *B41J 2/055* (2013.01); *C04B 35/462* (2013.01); *G01C 19/5628* (2013.01); *H01L 41/0973* (2013.01); *H01L 41/113* (2013.01); *H01L 41/1132* (2013.01); *H01L 41/1871* (2013.01); *H01L 41/1873* (2013.01); *H01L 41/1878* (2013.01); *H01L 41/316* (2013.01); *B41J 2/14233* (2013.01); *C23C 14/08* (2013.01); *G01C 19/56* (2013.01); *G01C 19/5607* (2013.01); *H02N 2/186* (2013.01); *C23C 14/3414* (2013.01); *C30B 23/02* (2013.01); *C30B 29/22* (2013.01); *B32B 18/00* (2013.01); *C04B 35/468* (2013.01); *C04B 35/475* (2013.01); *C04B 35/50* (2013.01); *C04B 2235/3201* (2013.01); *C04B 2235/3215* (2013.01); *C04B 2235/3227* (2013.01); *C04B 2235/3262* (2013.01); *C04B 2235/3272* (2013.01); *C04B 2235/3279* (2013.01); *C04B 2235/3281* (2013.01); *C04B 2235/3298* (2013.01); *C04B 2235/787* (2013.01)

(56) References Cited

U.S. PATENT DOCUMENTS

| 7,235,917 | B2* | 6/2007 | Fukui et al. ................... 310/364 |
| 7,870,787 | B2 | 1/2011 | Harigai et al. |
| 7,985,348 | B2* | 7/2011 | Tsukada et al. ........ 252/62.9 PZ |
| 2010/0289383 | A1 | 11/2010 | Harigai et al. |
| 2011/0101828 | A1 | 5/2011 | Noda et al. |
| 2011/0143146 | A1* | 6/2011 | Harigai et al. .................. 347/70 |
| 2012/0038715 | A1 | 2/2012 | Harigai et al. |

FOREIGN PATENT DOCUMENTS

| JP | 04-060073 A | 2/1992 |
| JP | 2000-128632 A | 5/2000 |
| JP | 4140796 B2 | 6/2002 |
| JP | 2007-019302 A | 1/2007 |
| JP | 2007-099618 A | 4/2007 |
| JP | 2007-266346 A | 10/2007 |
| WO | 2009-157189 A1 | 12/2009 |
| WO | 2010-047049 A1 | 4/2010 |
| WO | 2010-084711 A1 | 7/2010 |
| WO | 2010-122707 A1 | 10/2010 |
| WO | 2011-158490 A1 | 12/2011 |

OTHER PUBLICATIONS

Japanese Office Action issued in corresponding Japanese Application No. 61-72657, with English translation, Apr. 1, 1986.
Jarupoom, P., et al.: "Lead-free ternary perovskite compounds with large electromechanical strains", Applied Physics Letters 99, 152901, 2011.
Zhou, C., et al.: "Structure and electrical properties of $Bi_{0.5}Na_{0.5}TiO_3$-$Bi_{0.5}K_{0.5}TiO_3$-$BiCoO_3$ lead-free piezoelecric ceramics", Springer Science+Business Media, LLC, published May 15, 2009.
Dai, Ye-Jing, et al.: "Piezoelectric and Ferroelectric Properties of Li-Doped $(Bi_{0.5}Na_{0.5})TiO_3$-$(Bi_{0.5}K_{0.5})TiO_3$-$BaTiO_3$ Lead-Free Piezoelectric Ceramics", Jounral of the American Ceramic Society, 93 [4], 2010, pp. 1108-1113.
Takenaka, T., et al.: "$(Bi_{1/2}Na_{1/2})TiO_3$-$BaTiO_3$ System for Lead-Free Piezoelectric Ceramics", Japanese Journal of Applied Physics, vol. 30, No. 9B, Sep. 1991, pp. 2236-2239.
Zhang, Shan-Tao, et al.: "Morphotropic phase boundary and electrical properties in $(1-x)Bi_{0.5}Na_{0.5}TiO_3$-$xBi(Zn_{0.5}Ti_{0.5})O_3$ lead-free piezoceramics", Journal of Applied Physics 107, 114110 (2010).
Ramana, E. V., et al.: "Synthesis and magnetoelectric studies on $Na_{0.5}Bi_{0.5}TiO_3$-$BiFeO_3$ solid solution ceramics", Solid State Sciences 2 (2010), pp. 956-962.
International Search Report issued in PCT/JP2013/000145, dated Mar. 12, 2013.

* cited by examiner

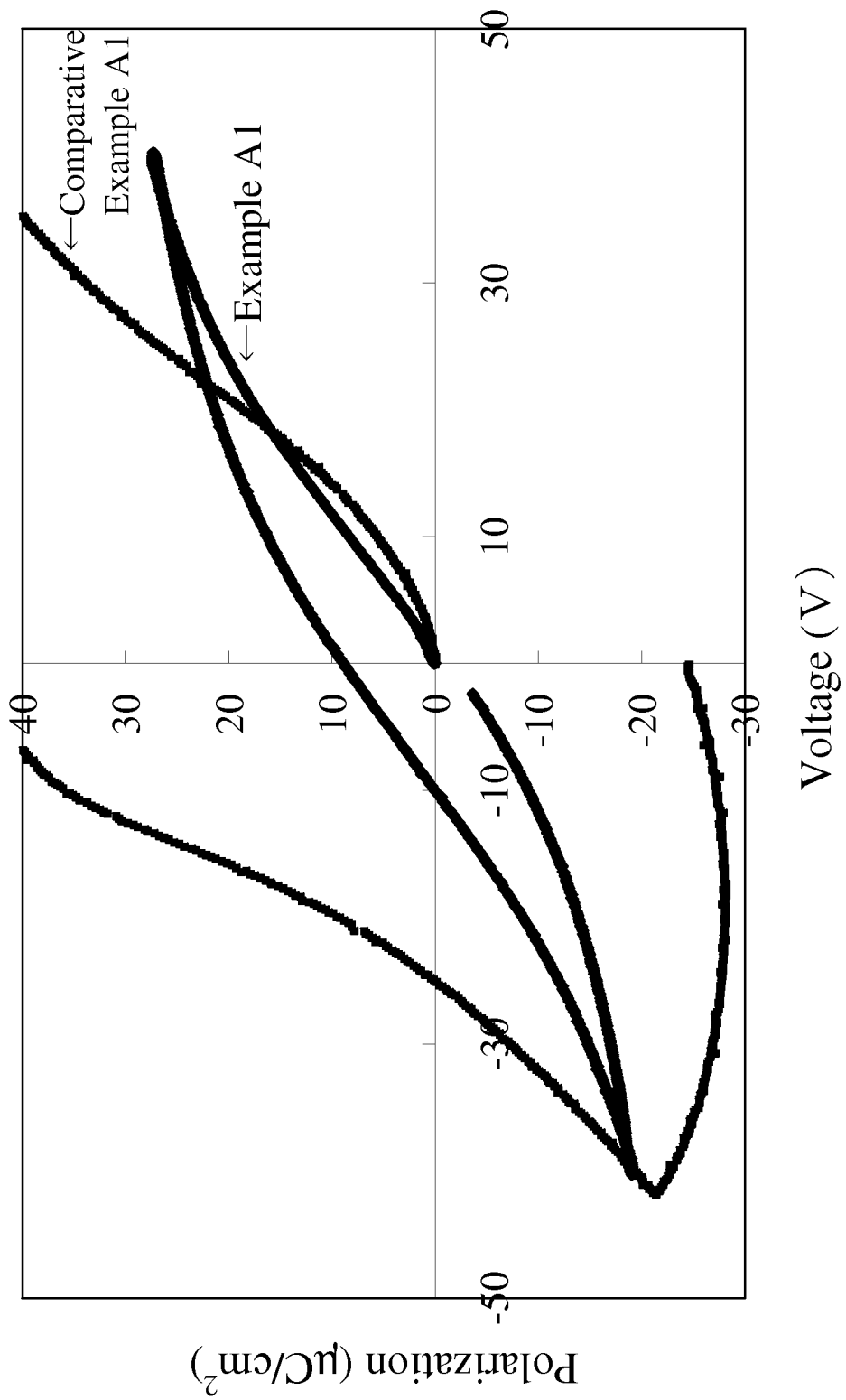

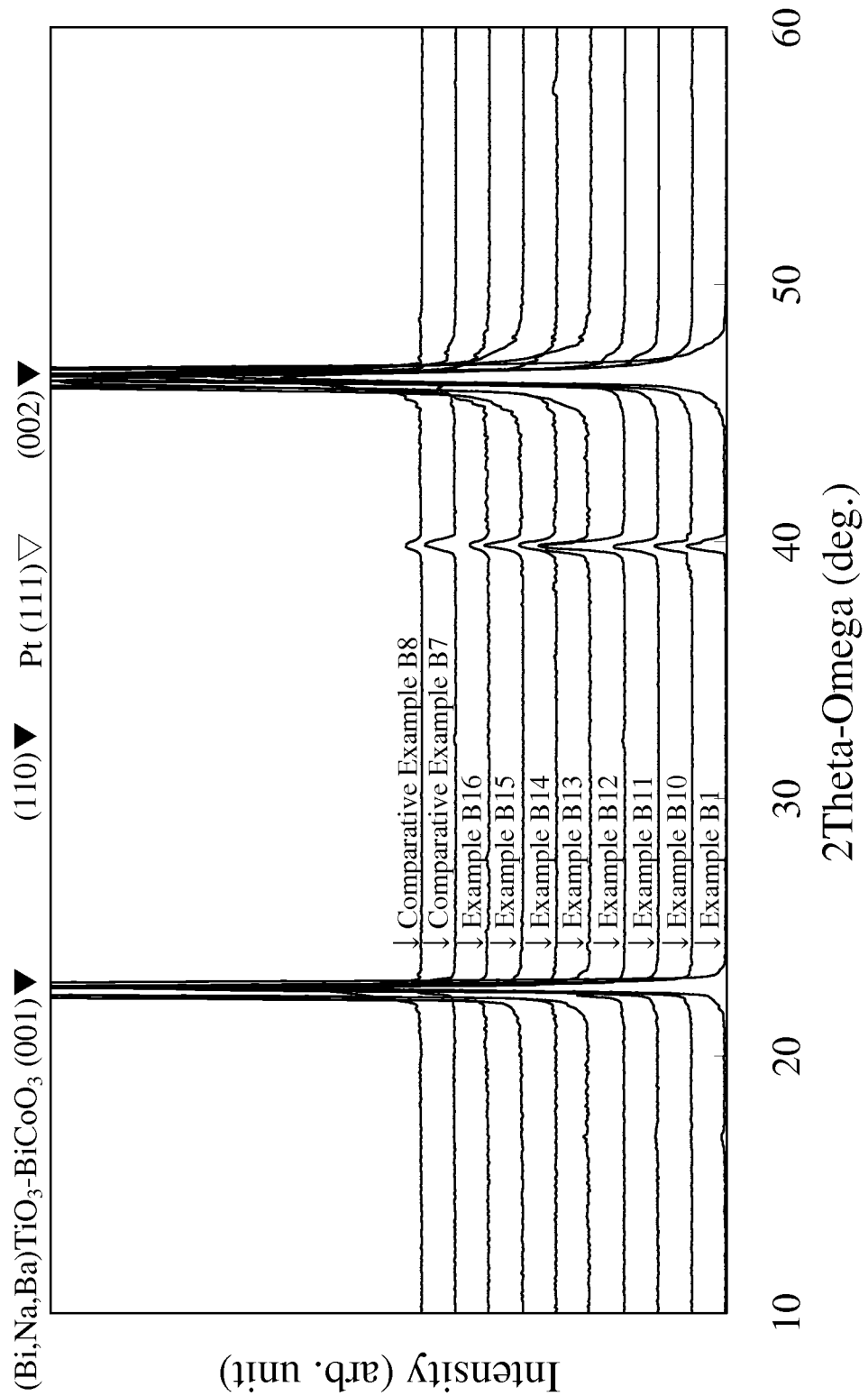

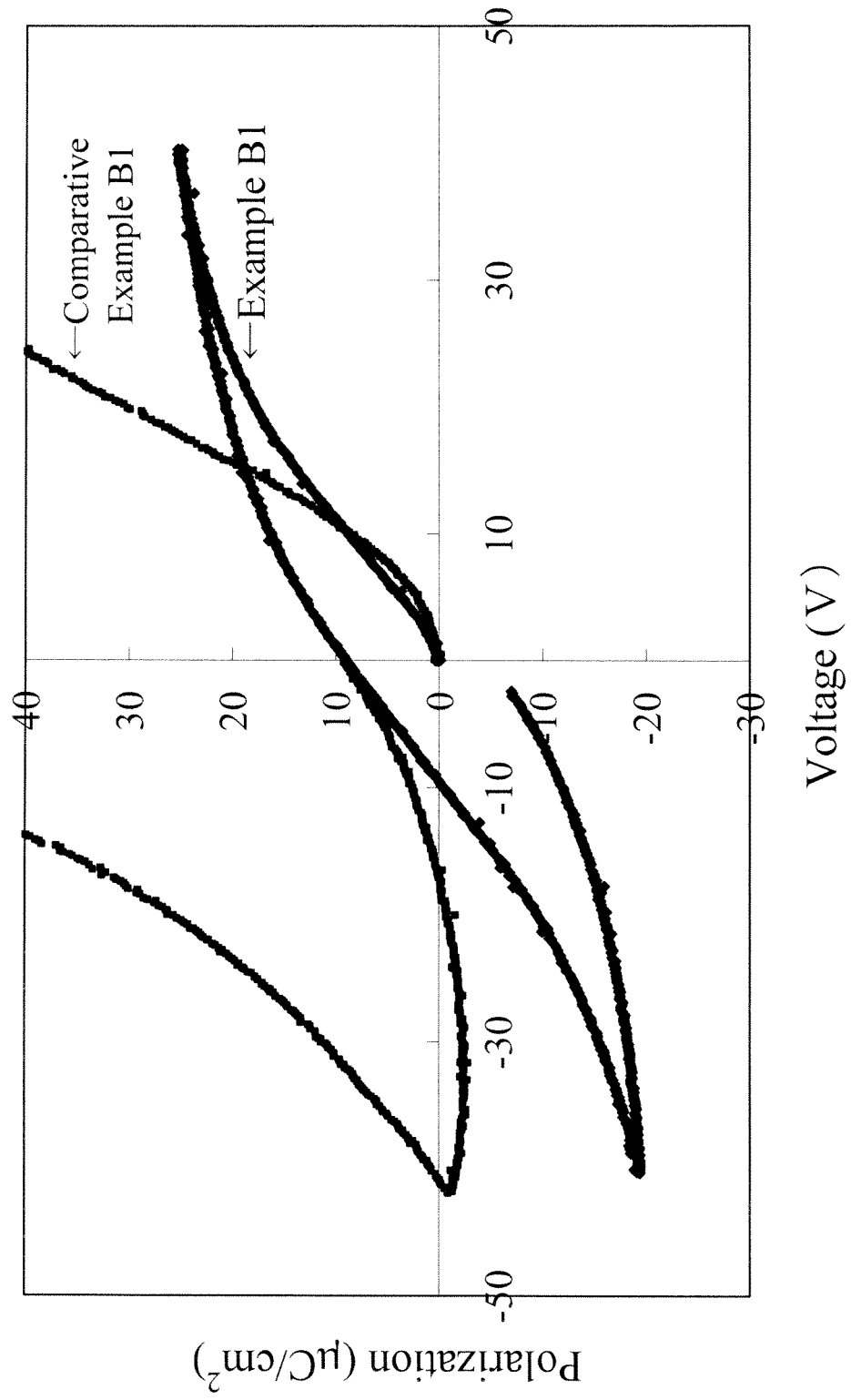

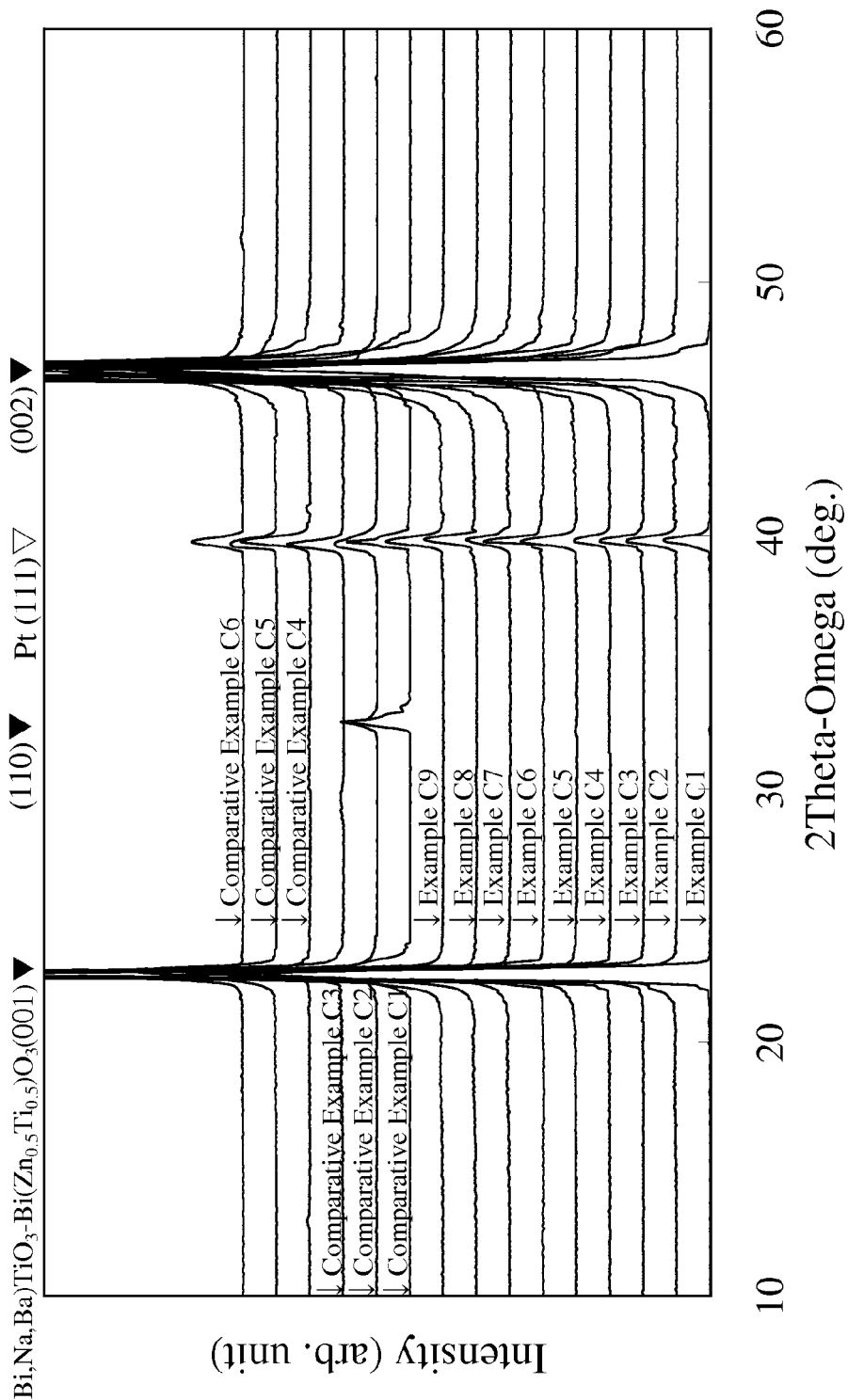

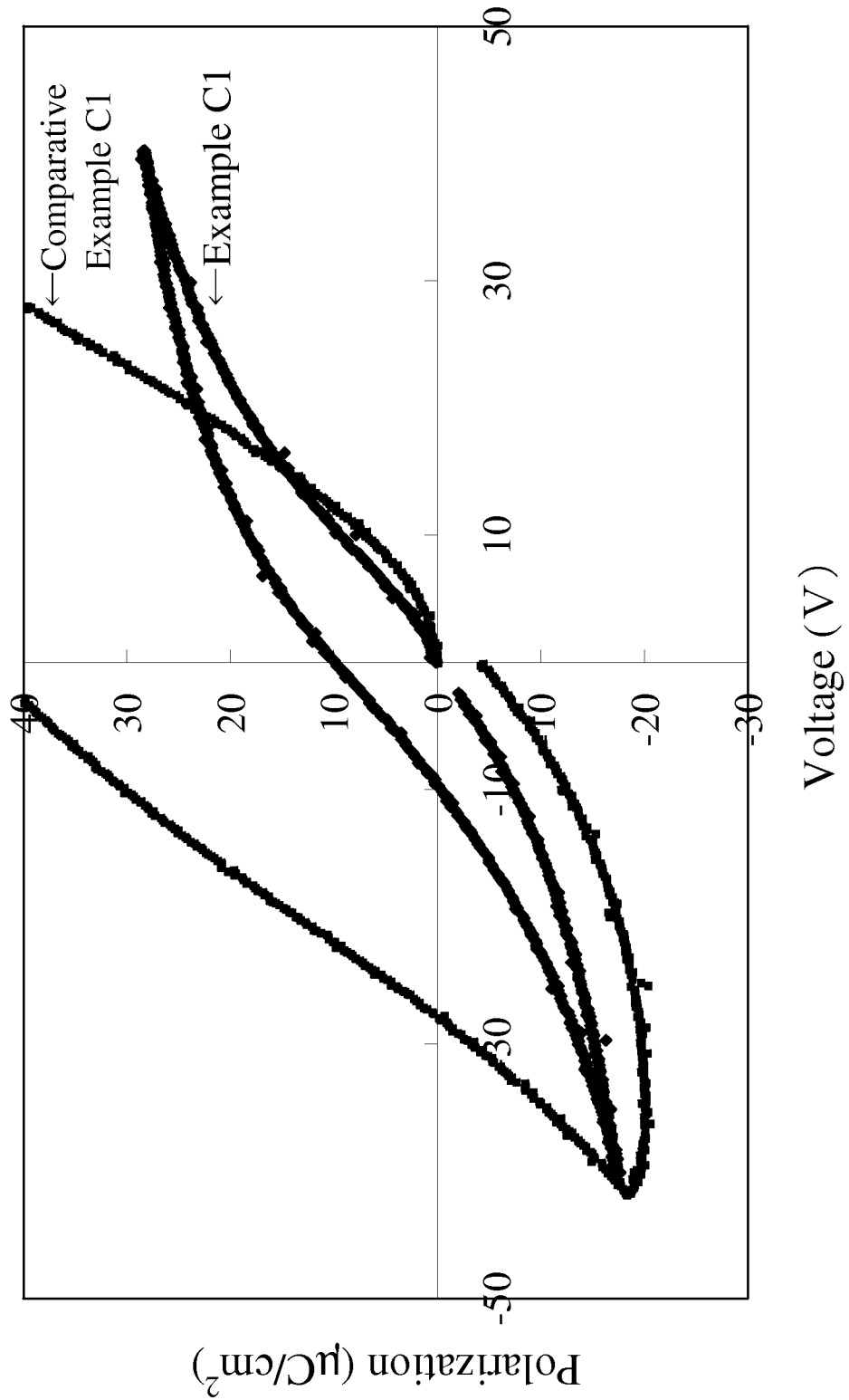

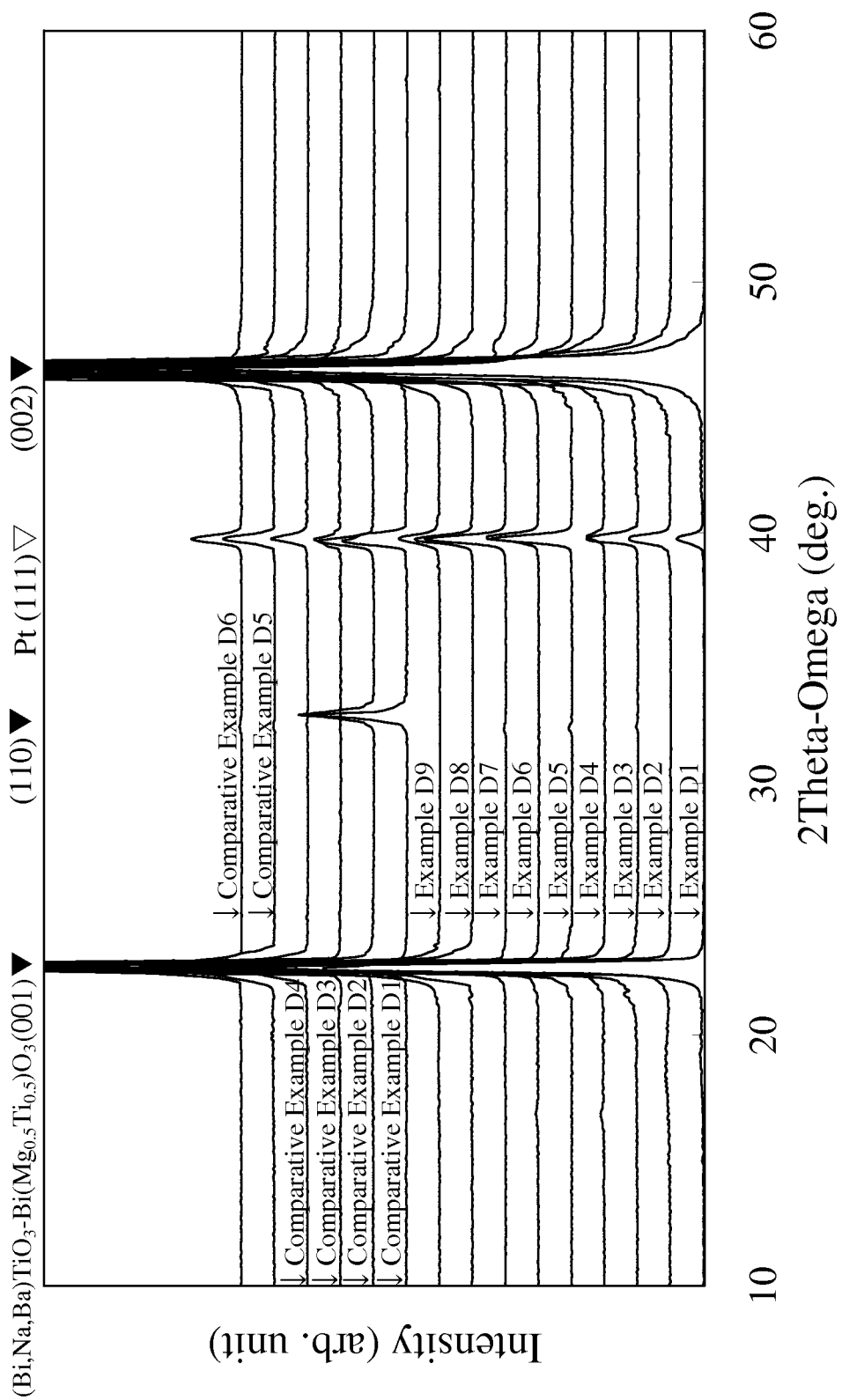

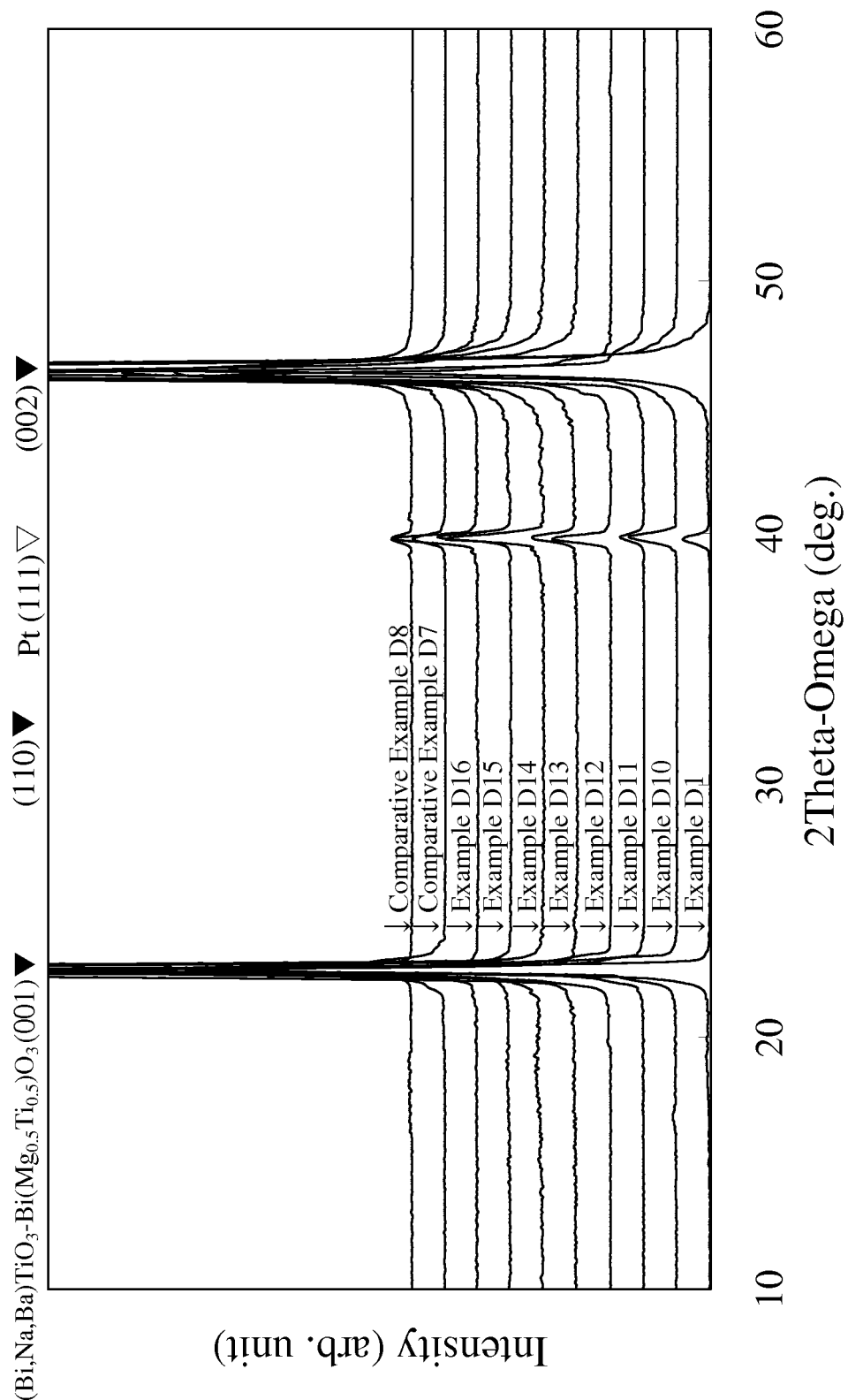

PIEZOELECTRIC FILM, INK JET HEAD, METHOD OF FORMING IMAGE BY THE INK JET HEAD, ANGULAR VELOCITY SENSOR, METHOD OF MEASURING ANGULAR VELOCITY BY THE ANGULAR VELOCITY SENSOR, PIEZOELECTRIC GENERATING ELEMENT, AND METHOD OF GENERATING ELECTRIC POWER USING THE PIEZOELECTRIC GENERATING ELEMENT

This is a continuation of International Application No. PCT/JP2013/000145, with an international filing date of Jan. 16, 2013, which claims priority of Japanese Patent Application No. 2012-021424, filed on Feb. 3, 2012, Japanese Patent Application No. 2012-047637, filed on Mar. 5, 2012, Japanese Patent Application No. 2012-048761, filed on Mar. 6, 2012, and Japanese Patent Application No. 2012-050053, filed on Mar. 7, 2012, the contents of which are hereby incorporated by reference.

BACKGROUND OF THE INVENTION

1. Field of the Invention

The present invention relates to a piezoelectric film comprising a piezoelectric layer. The present invention further relates to an ink jet head comprising the piezoelectric film and a method of forming an image by the head, to an angular velocity sensor comprising the piezoelectric film and a method of measuring an angular velocity by the sensor, and to a piezoelectric generating element comprising the piezoelectric film and a method of generating electric power using the element.

2. Description of the Related Art

Perovskite composite oxide $[(Bi, Na)_{1-6}Ba_6]TiO_3$ (hereinafter, referred to as "NBT-BT") has been recently researched and developed as a non-lead (lead-free) ferroelectric material.

Japanese Patent Publication No. Hei 4-60073 and T. Takenaka et al., Japanese Journal of Applied Physics, Vol. 30, No. 9B, (1991), pp. 2236-2239 disclose that a NBT-BT layer has high piezoelectric performance when the NBT-BT layer has a composition around the Morphotropic Phase Boundary (hereinafter, referred to as "MPB") having a barium molar ratio $\beta(=[Ba/(Bi+Na+Ba)])$ of 3-15%.

Japanese Patent Publication No. 4140796 and E. V. Ramana et al., Solid State Sciences, Vol. 12, (2010), pp. 956-962 disclose that $(1-\alpha)(Bi,Na,Ba)TiO_3-\alpha BiFeO_3$ where perovskite composite oxide NBT-BT is combined with perovskite composite oxide $BiFeO_3$. The piezoelectric performance of the $(1-\alpha)(Bi,Na,Ba)TiO_3-\alpha BiFeO_3$ is maintained even at a solder reflow temperature of 180 degree Celsius.

C. Zhou et al., Journal of Material Science, Vol. 44, (2009), pp. 3833-3840 discloses that $(1-\alpha)(Bi,Na,Ba)TiO_3-\alpha BiCoO_3$ where perovskite composite oxide NBT-BT is combined with perovskite composite oxide $BiCoO_3$. The piezoelectric performance of the $(1-\alpha)(Bi,Na,Ba)TiO_3-\alpha BiCoO_3$ is maintained even at a solder reflow temperature of 180 degree Celsius.

S-T. Zhang et al., Journal of Applied Physics, Vol. 107, (2010), 114110, 4 pp. discloses that $(1-\alpha)(Bi,Na,Ba)TiO_3-\alpha Bi(Zn_{0.5}Ti_{0.5})O_3$ where perovskite composite oxide NBT-BT is combined with perovskite composite oxide $Bi(Zn_{0.5}Ti_{0.5})O_3$. The piezoelectric performance of the $(1-\alpha)(Bi,Na,Ba)TiO_3-\alpha Bi(Zn_{0.5}Ti_{0.5})O_3$ is maintained even at a solder reflow temperature of 180 degree Celsius.

P. Jarupoom et al., Applied Physics Letters, Vol. 99, (2011), 152901 3 pp. discloses that $(1-\alpha)(Bi,Na,Ba)TiO_3-\alpha Bi(Mg_{0.5}Ti_{0.5})O_3$ where perovskite composite oxide NBT-BT is combined with perovskite composite oxide $Bi(Mg_{0.5}Ti_{0.5})O_3$. The piezoelectric performance of the $(1-\alpha)(Bi,Na,Ba)TiO_3-\alpha Bi(Mg_{0.5}Ti_{0.5})O_3$ is maintained even at a solder reflow temperature of 180 degree Celsius.

The $(1-\alpha)(Bi, Na, Ba)TiO_3-\alpha Bi(Mg_{0.5}Ti_{0.5})O_3$ has been also expected as a non-lead ferroelectric material capable of being used instead of PZT. However, the $(1-\alpha)(Bi, Na, Ba)TiO_3-\alpha Bi(Mg_{0.5}Ti_{0.5})O_3$ has a lower piezoelectric performance than the PZT.

A buffer layer can be interposed between a substrate and a piezoelectric film to improve the piezoelectric performance of the piezoelectric film. The buffer layer is referred to as an interface layer. Japanese Patent Laid-Open Publication No. 2007-266346 and Japanese Patent Laid-Open Publication No. 2007-019302 disclose a buffer layer including at least one element contained in the piezoelectric film.

A ferroelectric material containing $(Bi, Na, Ba)TiO_3$, $BiFeO_3$, $BiCoO_3$, $Bi(Zn_{0.5}Ti_{0.5})O_3$, or $Bi(Mg_{0.5}Ti_{0.5})O_3$ has high dielectric loss. When the dielectric loss is high, the ferroelectric performance and the piezoelectric performance are decreased significantly.

International Patent Publication WO2010/084711 discloses an NBT-BT layer formed on a $LaNiO_3$ layer.

SUMMARY OF THE INVENTION

The purpose of the present invention is to provide a non-lead piezoelectric film having high crystalline orientation, the low dielectric loss, the high polarization-disappear temperature, the high piezoelectric constant, and the high linearity between an applied electric field and an amount of displacement.

It is another object of the present invention to provide an ink jet head, an angular velocity sensor, and a piezoelectric generating element, each including the lead-free piezoelectric film. It is still another object of the present invention to provide a method of forming an image by this ink jet head, a method of measuring an angular velocity by this angular velocity sensor, and a method of generating electric power using this piezoelectric generating element.

The present invention is a piezoelectric film comprising:
a $Na_xLa_{1-x+y}Ni_{1-y}O_{3-x}$ layer 13 having only an (001) orientation; and
a $(1-\alpha)(Bi, Na, Ba)TiO_3-\alpha BiQO_3$ layer 15 having only an (001) orientation; wherein
the $(1-\alpha)(Bi, Na, Ba)TiO_3-\alpha BiQO_3$ layer 15 is formed on the $Na_xLa_{1-x+y}Ni_{1-y}O_{3-x}$ layer 13;
Q represents Fe, Co, $Zn_{0.5}Ti_{0.5}$, or $Mg_{0.5}Ti_{0.5}$;
x represents a value of not less than 0.01 and not more than 0.05;
y represents a value of not less than 0.05 and not more than 0.20; and
α represents a value of not less than 0.20 and not more than 0.50.

The present invention is an ink jet head comprising:
a piezoelectric film having a piezoelectric layer sandwiched between a first electrode and a second electrode;
a vibration layer bonded to the piezoelectric film; and
a pressure chamber member having a pressure chamber for storing ink and bonded to a surface of the vibration layer opposite to a surface to which the piezoelectric film is bonded; wherein
the vibration layer is bonded to the piezoelectric film so that the vibration layer is displaceable in its film thickness direction according to a displacement of the piezoelectric film produced by a piezoelectric effect;

the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber;

the first electrode comprises a $Na_xLa_{1-x+y}Ni_{1-y}O_{3-x}$ layer 13 having only an (001) orientation;

the piezoelectric layer is a $(1-\alpha)(Bi, Na, Ba)TiO_3\text{-}\alpha BiQO_3$ layer 15 having only an (001) orientation;

Q represents Fe, Co, $Zn_{0.5}Ti_{0.5}$, or $Mg_{0.5}Ti_{0.5}$;

x represents a value of not less than 0.01 and not more than 0.05;

y represents a value of not less than 0.05 and not more than 0.20; and

α represents a value of not less than 0.20 and not more than 0.50.

The present invention is a method of forming an image by an ink jet head, the method comprising:

a step (a) of preparing the ink jet head, wherein the ink jet head includes: a piezoelectric film having a piezoelectric layer sandwiched between a first electrode and a second electrode; a vibration layer bonded to the piezoelectric film; and a pressure chamber member having a pressure chamber for storing ink and bonded to a surface of the vibration layer opposite to a surface to which the piezoelectric film is bonded, the vibration layer is bonded to the piezoelectric film so that the vibration layer is displaceable in its film thickness direction according to a displacement of the piezoelectric film produced by a piezoelectric effect, the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber, the first electrode comprises a $Na_xLa_{1-x+y}Ni_{1-y}O_{3-x}$ layer 13 having only an (001) orientation;

the piezoelectric layer is a $(1-\alpha)(Bi, Na, Ba)TiO_3\text{-}\alpha BiQO_3$ layer 15 having only an (001) orientation;

Q represents Fe, Co, $Zn_{0.5}Ti_{0.5}$, or $Mg_{0.5}Ti_{0.5}$;

x represents a value of not less than 0.01 and not more than 0.05;

y represents a value of not less than 0.05 and not more than 0.20; and

α represents a value of not less than 0.20 and not more than 0.50; and a step (b) of applying a voltage to the piezoelectric layer through the first electrode and the second electrode to displace, based on the piezoelectric effect, the vibration layer in its film thickness direction so that the volumetric capacity of the pressure chamber changes and the ink is ejected from the pressure chamber by the displacement.

The present invention is an angular velocity sensor comprising:

a substrate having a vibration part; and a piezoelectric film bonded to the vibration part and having a piezoelectric layer sandwiched between a first electrode and a second electrode, wherein the first electrode comprises a $Na_xLa_{1-x+y}Ni_{1-y}O_{3-x}$ layer 13 having only an (001) orientation;

the piezoelectric layer is a $(1-\alpha)(Bi, Na, Ba)TiO_3\text{-}\alpha BiQO_3$ layer 15 having only an (001) orientation;

Q represents Fe, Co, $Zn_{0.5}Ti_{0.5}$, or $Mg_{0.5}Ti_{0.5}$;

x represents a value of not less than 0.01 and not more than 0.05;

y represents a value of not less than 0.05 and not more than 0.20;

a represents a value of not less than 0.20 and not more than 0.50; and one of the first electrode and the second electrode selected therefrom is composed of an electrode group including a drive electrode for applying a driving voltage that oscillates the vibration part to the piezoelectric layer and a sense electrode for measuring a displacement of the vibration part caused by an angular velocity applied to the oscillating vibration part.

The present invention is a method of measuring an angular velocity by an angular velocity sensor, the method comprising:

a step (a) of preparing the angular velocity sensor, wherein the angular velocity sensor includes: a substrate having a vibration part; and a piezoelectric film bonded to the vibration part and having a piezoelectric layer sandwiched between a first electrode and a second electrode, the first electrode comprises a $Na_xLa_{1-x+y}Ni_{1-y}O_{3-x}$ layer 13 having only an (001) orientation;

the piezoelectric layer is a $(1-\alpha)(Bi, Na, Ba)TiO_3\text{-}\alpha BiQO_3$ layer 15 having only an (001) orientation;

Q represents Fe, Co, $Zn_{0.5}Ti_{0.5}$, or $Mg_{0.5}Ti_{0.5}$;

x represents a value of not less than 0.01 and not more than 0.05;

y represents a value of not less than 0.05 and not more than 0.20;

α represents a value of not less than 0.20 and not more than 0.50; and one of the first electrode and the second electrode selected therefrom is composed of an electrode group including a drive electrode and a sense electrode;

a step (b) of applying a driving voltage to the piezoelectric layer through the drive electrode and the other of the first electrode and the second electrode selected therefrom to oscillate the vibration part; and a step (c) of measuring, through the other electrode and the sense electrode, a displacement of the vibration part caused by an angular velocity applied to the oscillating vibration part to obtain a value of the applied angular velocity.

The present invention is a piezoelectric generating element comprising:

a substrate having a vibration part; and a piezoelectric film bonded to the vibration part and having a piezoelectric layer sandwiched between a first electrode and a second electrode, wherein the first electrode comprises a $Na_xLa_{1-x+y}Ni_{1-y}O_{3-x}$ layer 13 having only an (001) orientation;

the piezoelectric layer is a $(1-\alpha)(Bi, Na, Ba)TiO_3\text{-}\alpha BiQO_3$ layer 15 having only an (001) orientation;

Q represents Fe, Co, $Zn_{0.5}Ti_{0.5}$, or $Mg_{0.5}Ti_{0.5}$;

x represents a value of not less than 0.01 and not more than 0.05;

y represents a value of not less than 0.05 and not more than 0.20; and

α represents a value of not less than 0.20 and not more than 0.50.

The present invention is a method of generating electric power using a piezoelectric generating element, the method comprising:

a step (a) of preparing the piezoelectric generating element, wherein the piezoelectric generating element includes: a substrate having a vibration part; and a piezoelectric film bonded to the vibration part and having a piezoelectric layer sandwiched between a first electrode and a second electrode, the first electrode comprises a $Na_xLa_{1-x+y}Ni_{1-y}O_{3-x}$ layer 13 having only an (001) orientation;

the piezoelectric layer is a $(1-\alpha)(Bi, Na, Ba)TiO_3-\alpha BiQO_3$ layer 15 having only an (001) orientation;

Q represents Fe, Co, $Zn_{0.5}Ti_{0.5}$, or $Mg_{0.5}Ti_{0.5}$;

x represents a value of not less than 0.01 and not more than 0.05;

y represents a value of not less than 0.05 and not more than 0.20; and

α represents a value of not less than 0.20 and not more than 0.50; and a step (b) of vibrating the vibration part to obtain electric power through the first electrode and the second electrode.

The $(1-\alpha)(Bi, Na, Ba)TiO_3-\alpha BiQO_3$ layer 15 may be in contact with the $Na_xLa_{1-x+y}Ni_{1-y}O_{3-x}$ layer 13.

The $(1-\alpha)(Bi, Na, Ba)TiO_3-\alpha BiQO_3$ layer 15 may contain Mn.

The present invention provides a non-lead piezoelectric film having the high crystalline orientation, the low dielectric loss, the high polarization-disappear temperature, the high piezoelectric constant, and the high linearity.

The present invention provides an ink jet head comprising the non-lead piezoelectric film, and a method for forming an image by this ink jet head.

The present invention provides an angular velocity comprising the non-lead piezoelectric film, and a method for measuring an angular velocity by this angular velocity sensor.

The present invention provides a piezoelectric generating element comprising the non-lead piezoelectric film, and a method for generating electric power using this piezoelectric generating element.

Other features, elements, processes, steps, characteristics and advantages of the present invention will become more apparent from the following detailed description of preferred embodiments of the present invention with reference to the attached drawings.

BRIEF DESCRIPTION OF DRAWINGS

FIG. 2C shows a P-E hysteresis curve of the piezoelectric film according to the example A1 and the comparative example A1.

FIG. 3B shows an X-ray diffraction profile of the piezoelectric films according to the example B1, the examples B10-B12, the comparative example B7, and the comparative example B8.

FIG. 3C shows a P-E hysteresis curve of the piezoelectric film according to the example B1 and the comparative example B1.

FIG. 4A shows an X-ray diffraction profile of the piezoelectric films according to the examples C1-C9 and the comparative examples C1-C6.

FIG. 4C shows a P-E hysteresis curve of the piezoelectric film according to the example C1 and the comparative example C1.

FIG. 5A shows an X-ray diffraction profile of the piezoelectric films according to the examples D1-D9 and the comparative examples D1-D6.

FIG. 5B shows an X-ray diffraction profile of the piezoelectric films according to the example D1, the examples D10-D12, the comparative example D7, and the comparative example D8.

DETAILED DESCRIPTION OF THE INVENTION

Figure 1A:
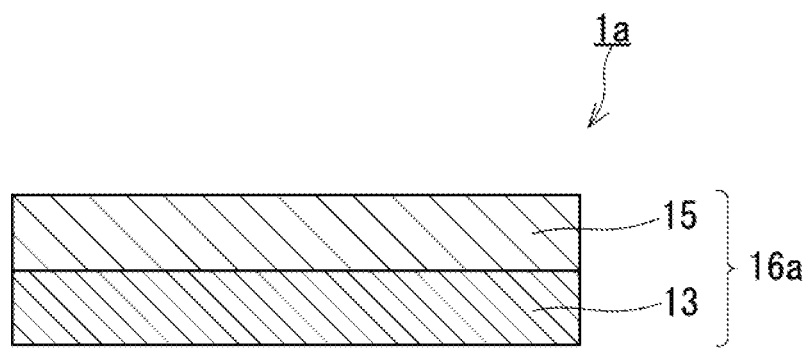
FIG. 1A shows a cross-sectional view of a piezoelectric film according to the embodiment.

The embodiment of the present invention is described below with reference to the drawings. In the following description, the same reference numerals are used to designate the same elements and parts, and therefore the overlapping description thereof can be omitted.

(Definition of Term)

The term used in the instant specification is defined as below.

The term "linearity" means linearity between an applied electric field and an amount of displacement. It is desirable that the linearity is high. The phrase "linearity is high" means that the amount of displacement is proportional to the applied electric field.

The term "electric field" means an electric field applied to a piezoelectric layer.

The term "amount of displacement" means the displacement amount of the piezoelectric layer generated by the applied electric field.

The relationship between the amount of the displacement and the applied electric field is described below.

For the angular velocity sensor capable of measuring an exact angular velocity, for the ink jet head capable of ejecting an exact amount of an ink, and for the piezoelectric power generation element capable of generating electric power due to positive piezoelectric effect, the amount of the displacement is required to be proportional to the electric field. Namely, the amount b of the displacement and the electric field a are required to satisfy the following equation (1).

$$b = c_1 a \qquad \text{Equation (1)}$$

($c_1$ is constant)

The term "proportion" in the present specification means that the values of a and b safisfy the above-mentioned equation (1). In other words, the term "proportion" means a linear function. The term "proportion" does not include a quadratic function.

Figure 6A:
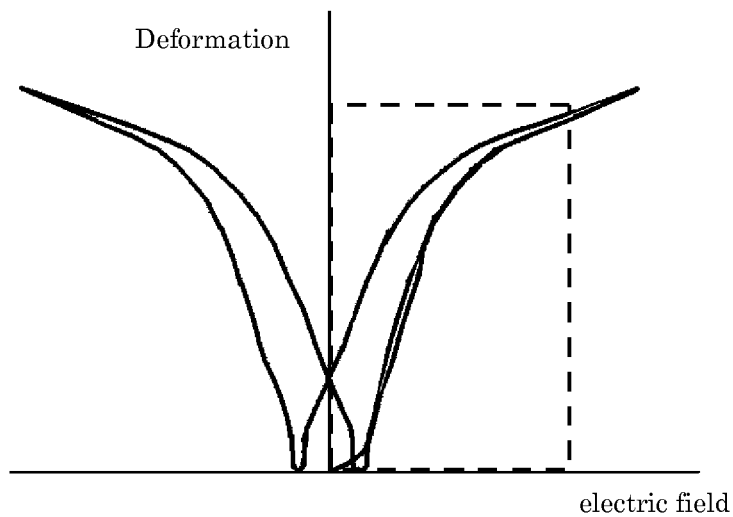
FIG. 6A shows a graph of an electric field—an amount of displacement property of a conventional piezoelectric material.
Figure 6B:
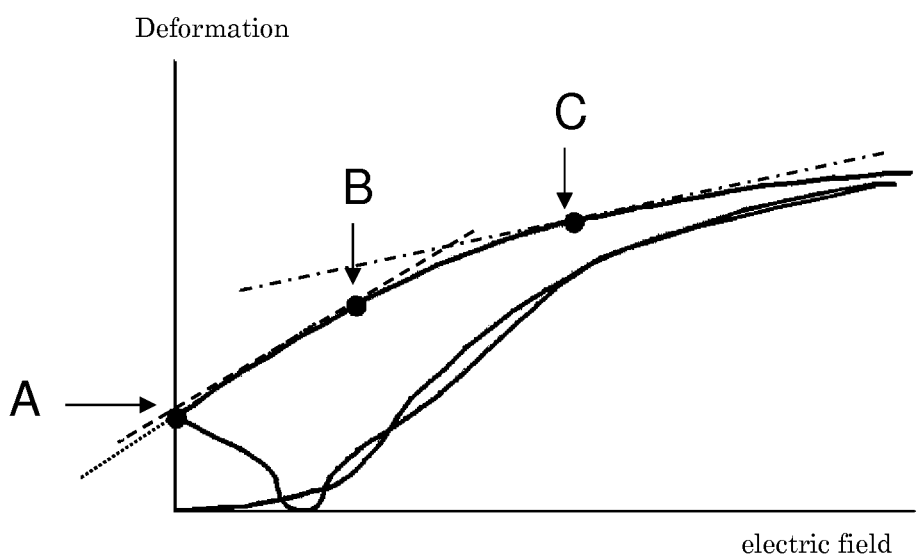
FIG. 6B shows a partially enlarged view of FIG. 6A.

FIG. 6A shows a graph of an electric field—an amount of displacement property of a conventional piezoelectric material. FIG. 6B shows a partially enlarged view of FIG. 6A.

As shown in FIG. 6B, the inclination of the tangent line at the dot A is substantially equal to the inclination of the tangent line at the dot B. The phrase "substantially equal" means that the ratio represented by the formula: (the inclination of the tangent line at the dot A)/(the inclination of the tangent line at the dot B) is not less than 0.8 and not more than 1.2. This means that the amount b of the displacement is proportional to the electric field a. The applied electric fields at the dot A and at the dot B are, for example, 3V/μm and 10V/μm, respectively.

On the other hand, the tangent line at the dot C has a small inclination than the tangent lines at the dot A and at the dot B.

When the amount b of the displacement and the electric field a has a relationship of a non-linear function, it is difficult to measure an exact angular velocity, to eject an exact amount of an ink, and to generate an electric power due to positive piezoelectric effect. The relationship of the non-linear function is not suitable for the angular velocity sensor capable of measuring an exact angular velocity, for the ink jet head capable of ejecting an exact amount of an ink, and for the piezoelectric power generation element capable of generating electric power due to positive piezoelectric effect.

The term "Temperature Td" means the temperature when a polarization included in the piezoelectric layer disappears completely by heating the piezoelectric layer. In other words, the piezoelectric layer completely loses its polarization in a temperature more than the temperature Td. The piezoelectric layer which does not have the polarization fails to serve as a piezoelectric layer. In view of the solder reflow, it is desirable that the temperature Td is not less than 180 degrees Celsius.

(Piezoelectric Film)

FIG. 1A shows a piezoelectric film according to the embodiment. The piezoelectric film 1a shown in FIG. 1A has a multilayer structure 16a. This multilayer structure 16a has a $Na_xLa_{1-x+y}Ni_{1-y}O_{3-x}$ layer 13 having only a (001) orientation and a $(1-\alpha)$ (Bi, Na, Ba) $TiO_3$-$\alpha BiQO_3$ layer 15 having only a (001) orientation.

The $(1-\alpha)$ (Bi, Na, Ba) $TiO_3$-$\alpha BiQO_3$ layer 15 has only a (001) orientation. In other words, the $(1-\alpha)$ $TiO_3$-$\alpha BiQO_3$ layer 15 does not have a orientation other than a (001) orientation. For example, the $(1-\alpha)$ (Bi, Na, Ba) $TiO_3$-$\alpha BiQO_3$ layer 15 does not have a (110) orientation. See the comparative examples 1-2, which are described later.

Similarly, the $Na_xLa_{1-x+y}Ni_{1-y}O_{3-x}$ layer 13 has only a (001) orientation.

The character of Q represents Fe, Co, $Zn_{0.5}Ti_{0.5}$, or $Mg_{0.5}Ti_{0.5}$.

The character of x represents a value of not less 0.01 and not more than 0.05. When the value of x is less than 0.01, the crystalline orientation, the polarization-disappear temperature, the piezoelectric constant, and linearity are low. Furthermore, the dielectric loss is high. See the comparative examples A1, A3, B1, B3, C1, C3, D1 and D3, which are described later.

When the value of x is over 0.05, the crystalline orientation, the polarization-disappear temperature, the piezoelectric constant, and the linearity are low. Furthermore, the dielectric loss is high. See the comparative examples A4, B4, C4, and D4, which are described later.

The character of y represents a value of not less than 0.05 and not more than 0.20. When the value of y is less than 0.05, the crystalline orientation, the polarization-disappear temperature, the piezoelectric constant, and the linearity are low. Furthermore, the dielectric loss is high. See the comparative examples A1, A2, A5, B1, B2, B5, C1, C2, C5, D1, D2, and D5, which are described later.

When the value of y is over 0.20, the crystalline orientation, the polarization-disappear temperature, the piezoelectric constant, and the linearity are low. Furthermore, the dielectric loss is high. See the comparative examples A6, B6, C6, and D6, which are described later.

The character of a represents a value of not less than 0.20 and not more than 0.50. When the value of a is less than 0.20, the polarization-disappear temperature, the piezoelectric constant, and the linearity are low. Furthermore, the dielectric loss is high. See the comparative examples A7, B7, C7, and D7, which are described later.

When the value of a is over 0.50, the polarization-disappear temperature, the piezoelectric constant, and the linearity are low. Furthermore, the dielectric loss is high. See the comparative examples A8, B8, C8, and D8, which are described later.

It is desirable that these stacked layers are in contact with each other. The $(1-\alpha)$ (Bi, Na, Ba) $TiO_3$-$\alpha BiQO_3$ layer 15 serves as a piezoelectric layer. The $(1-\alpha)$ (Bi, Na, Ba) $TiO_3$-$\alpha BiQO_3$ layer 15 has a small leak current, a high crystallinity, and a high (001) orientation. For this reason, the $(1-\alpha)$ (Bi, Na, Ba) $TiO_3$-$\alpha BiQO_3$ layer 15 has the high polarization-disappear temperature, the low dielectric loss, and the high piezo performance, although the $(1-\alpha)$ (Bi, Na, Ba) $TiO_3$-$\alpha BiQO_3$ layer 15 does not contain lead. The $(1-\alpha)$ (Bi, Na, Ba) $TiO_3$-$\alpha BiQO_3$ layer 15 has the piezoelectric performance similar to that of the PZT layer. Furthermore, the amount of the displacement of the $(1-\alpha)$ (Bi, Na, Ba) $TiO_3$-$\alpha BiQO_3$ layer 15 is proportional to the applied electric field.

The $LaNiO_3$ layer has a perovskite-type crystal structure represented by the chemical formula $ABO_3$. The crystal structure has a lattice constant of 0.384 nm (pseudocubic crystal). Thus, the $Na_xLa_{1-x+y}Ni_{1-y}O_{3-x}$ layer 13 has a satisfactory lattice matching property with the $(1-\alpha)$ (Bi, Na, Ba) $TiO_3$-$\alpha BiQO_3$ layer 15. The $Na_xLa_{1-x+y}Ni_{1-y}O_{3-x}$ layer 13 has a (001) orientation regardless of the composition and crystal structure of a base layer thereof. For example, the $Na_xLa_{1-x+y}Ni_{1-y}O_{3-x}$ layer 13 having a (001) orientation can be formed on a monocrystalline Si substrate having a lattice constant (0.543 nm) significantly different from that of the $Na_xLa_{1-x}NiO_{3-x}$ layer 13. The $Na_xLa_{1-x+y}Ni_{1-y}O_{3-x}$ layer 13 having a (001) orientation can be formed also on a substrate made of metal such as stainless steel, a substrate made of an amorphous material such as glass, and a ceramic substrate.

The $Na_xLa_{1-x+y}Ni_{1-y}O_{3-x}$ layer 13 may contain a small amount of impurities. The impurity is typically a rare-earth element, which substitutes for La.

The $Na_xLa_{1-x+y}Ni_{1-y}O_{3-x}$ layer 13 may have a uniform composition in the thickness direction. Instead of this, the $Na_xLa_{1-x+y}Ni_{1-y}O_{3-x}$ layer 13 may have a composition in which x is increased or decreased in the thickness direction. In other words, the value of x on the surface which is in contact with the $(1-\alpha)$ (Bi, Na, Ba) $TiO_3$-$\alpha BiQO_3$ layer 15 may be different from the value of x on the surface which is NOT in contact with the $(1-\alpha)$ (Bi, Na, Ba) $TiO_3$-$\alpha BiQO_3$ layer 15. Since the $Na_xLa_{1-x+y}Ni_{1-y}O_{3-x}$ layer 13 serves as a buffer layer for forming the $(1-\alpha)$ (Bi, Na, Ba) $TiO_3$-$\alpha BiQO_3$ layer 15, it is necessary that an inequality: $0.01 \leq x \leq 0.05$ is satisfied on the surface where these layers are in contact with each other.

The $Na_xLa_{1-x+y}Ni_{1-y}O_{3-x}$ layer 13 is a conductive oxide. The $Na_xLa_{1-x+y}Ni_{1-y}O_{3-x}$ layer 13 can serve as a first electrode for applying a voltage to the $(1-\alpha)$ (Bi, Na, Ba) $TiO_3$-$\alpha BiQO_3$ layer 15.

Typically, the $Na_xLa_{1-x+y}Ni_{1-y}O_{3-x}$ layer 13 can be formed by sputtering. The $Na_xLa_{1-x+y}Ni_{1-y}O_{3-x}$ layer 13 can be formed by a thin film formation technique such as pulsed laser deposition (PLD), chemical vapor deposition (CVD), sol-gel processing, or aerosol deposition (AD).

The value of "3-x", which represents the oxygen amount in sodium lanthanum nickelate, may include error. For example, in a case where x=0.05, the value of "3-0.05" is 2.95. However, in the case where the content of sodium is 0.05, the oxygen amount in sodium lanthanum nickelate does not always correspond with 2.95 completely.

It is difficult to estimate the composition of the buffer layer suitable for forming a piezoelectric layer having high crystalline orientation, the low dielectric loss, the high polarization-disappear temperature, the high piezoelectric constant, and the high linearity, based on the similarity of the lattice constants or the compositions of these piezoelectric layer and buffer layer. In other words, a desirable piezoelectric layer having high crystallinity, high orientation, and small leak current cannot always be obtained simply by providing an buffer layer having a lattice constant or a composition similar to that of the piezoelectric layer. This is because it is generally difficult to form a thin film composed of a multicomponent composite oxide having high crystallinity and high orientation, like $(Bi,Na,Ba)TiO_3$—$BiQO_3$, due to a difference in the vapor pressure of each constituent element (except for oxygen) of the oxide. The present inventors have discovered that the $(1-\alpha)$ (Bi, Na, Ba) $TiO_3$-$\alpha BiQO_3$ layer 15 provided on the $Na_xLa_{1-x+y}Ni_{1-y}O_{3-x}$ layer 13 has high crystalline orientation, the low dielectric loss, the high polarization-disappear temperature, the high piezoelectric constant, and the high linearity.

The thickness of the $Na_xLa_{1-x+y}Ni_{1-y}O_{3-x}$ layer 13 is not limited. The thickness of at least several lattice units (about 2 nm) is large enough to obtain the $(1-\alpha)$ (Bi, Na, Ba) $TiO_3$-$\alpha BiQO_3$ layer 15 having high crystalline orientation, the low dielectric loss, the high polarization-disappear temperature, the high piezoelectric constant, and the high linearity.

The thickness of the $(1-\alpha)$ (Bi, Na, Ba) $TiO_3$-$\alpha BiQO_3$ layer 15 is also not limited. The thickness thereof is at least 0.5 μm but not more than 10 μm, for example.

The $(1-\alpha)$ (Bi, Na, Ba) $TiO_3$-$\alpha BiQO_3$ layer 15 has a perovskite-type crystal structure represented by the chemical formula $ABO_3$. The A site is Bi, Na, and Ba. The B site is Fe. The $(1-\alpha)$ (Bi, Na, Ba) $TiO_3$-$\alpha BiQO_3$ layer 15 may contain a minute amount of impurities. The impurities typically may be Li and K to substitute for Na, and Sr and Ca to substitute for Ba, in the A site. The impurity typically may be Zr to substitute for Ti in the B site. Examples of the other impurities may include Mn, Co, Al, Ga, Nb, and Ta. Some of these impurities can improve the crystallinity and piezoelectric performance of the $(1-\alpha)$ (Bi, Na, Ba) $TiO_3$-$aBiQO_3$ layer 15.

Typically, the $(1-\alpha)$ (Bi, Na, Ba) $TiO_3$-$\alpha BiQO_3$ layer 15 can be formed by sputtering. The $(1-\alpha)$ (Bi, Na, Ba) $TiO_3$-$\alpha BiQO_3$ layer 15 can be formed by another thin film formation technique such as PLD, CVD, sol-gel processing, or AD.

Figure 1B:
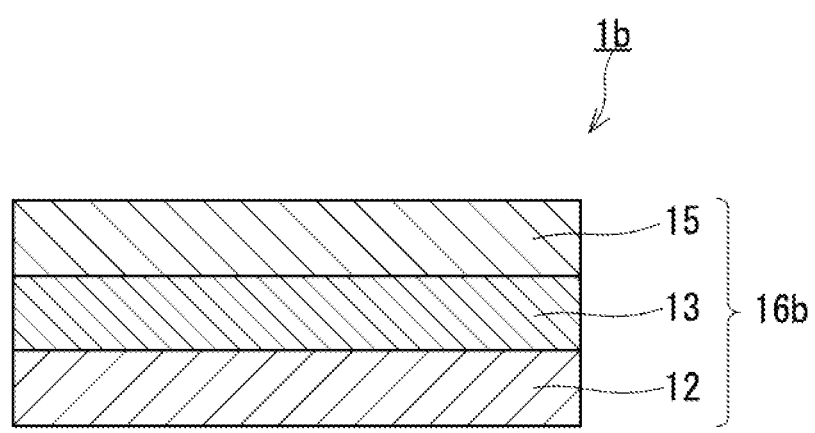
FIG. 1B shows a variation of the piezoelectric film shown in FIG. 1A.

FIG. 1B shows another embodiment of the piezoelectric film shown in FIG. 1A. A piezoelectric film 1b shown in FIG. 1B has a multilayer structure 16b. The multilayer structure 16b is a structure in which the multilayer structure 16a shown in FIG. 1A further includes a metal electrode layer 12. In the multilayer structure 16b, the $Na_xLa_{1-x+y}Ni_{1-y}O_{3-x}$ layer 13 is formed on this metal electrode layer 12. Particularly, the multilayer structure 16b has the metal electrode layer 12, the $Na_xLa_{1-x+y}Ni_{1-y}O_{3-x}$ layer 13, and the $(1-\alpha)$ (Bi, Na, Ba) $TiO_3$-$\alpha BiQO_3$ layer 15, in this order.

An example of the material for the metal electrode layer 12 is metal such as platinum, palladium, or gold; a conductive oxide such as nickel oxide, ruthenium oxide, iridium oxide, or strontium ruthenate. The metal electrode layer 12 can be made of two or more these materials. Preferably, the metal electrode layer 12 has a low electrical resistance and a high heat resistance. Therefore, it is preferred that the metal electrode layer 12 is a platinum layer. The Pt layer may have a (111) orientation.

In other words, the piezoelectric film according to the present embodiment may further comprise a platinum layer. The $Na_xLa_{1-x+y}Ni_{1-y}O_{3-x}$ layer 13 may be formed on the platinum layer.

The metal electrode layer 12 can serve as an electrode layer for applying a voltage to the $(1-\alpha)$ (Bi, Na, Ba) $TiO_3$-$\alpha BiQO_3$ layer 15 together with the $Na_xLa_{1-x+y}Ni_{1-y}O_{3-x}$ layer 13. In other words, the electrode layer is a laminate composed of the $Na_xLa_{1-x+y}Ni_{1-y}O_{3-x}$ layer 13 and the metal electrode layer 12.

The piezoelectric film 1b shown in FIG. 1B can be manufactured by forming the $Na_xLa_{1-x+y}Ni_{1-y}O_{3-x}$ layer 13, and the $(1-\alpha)$ (Bi, Na, Ba) $TiO_3$-$\alpha BiQO_3$ layer 15 on the metal electrode layer 12 in this order.

Figure 1C:
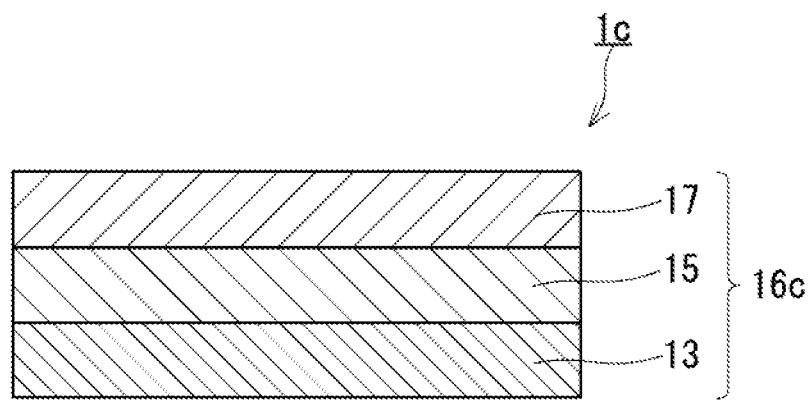
FIG. 1C shows a variation of the piezoelectric film shown in FIG. 1A.

FIG. 1C shows still another embodiment of the piezoelectric film according to the present invention. A piezoelectric film Ic shown in FIG. 1C has a multilayer structure 16c. The multilayer structure 16c is a structure in which the multilayer structure 16a shown in FIG. 1A further includes a conductive layer 17. The conductive layer 17 is a second electrode. The conductive layer 17 is formed on the $(1-\alpha)$ (Bi, Na, Ba) $TiO_3$-$\alpha BiQO_3$ layer 15. Particularly, the multilayer structure 16c has the $Na_xLa_{1-x+y}Ni_{1-y}O_{3-x}$ layer 13, the $(1-\alpha)$ (Bi, Na, Ba) $TiO_3$-$\alpha BiQO_3$ layer 15, and the conductive layer 17 in this order.

In the piezoelectric film ic, the $(1-\alpha)$ (Bi, Na, Ba) $TiO_3$-$\alpha BiQO_3$ layer 15 is interposed between the $Na_xLa_{1-x+y}Ni_{1-y}O_{3-x}$ layer 13 and the conductive layer 17. The $Na_xLa_{1-x+y}Ni_{1-y}O_{3-x}$ layer 13 and the conductive layer 17 can serve as a first electrode layer and a second electrode layer, respectively, for applying a voltage to the $(1-\alpha)$ (Bi, Na, Ba) $TiO_3$-$\alpha BiQO_3$ layer 15.

The conductive layer 17 is made of a conductive material. An example of the material is a metal having a low electrical resistance. The material may be a conductive oxide such as NiO, $RuO_2$, $IrO_3$, $SrRuO_3$, or $LaNiO_3$. The conductive layer 17 may be composed of two or more these materials. A metal layer may be provided between the conductive layer 17 and the (1-α) (Bi, Na, Ba) $TiO_3$-α$BiQO_3$ layer 15 to improve the adhesion therebetween. An example of the material of the metal layer is titanium. The material may be tantalum, iron, cobalt, nickel, or chrome. The metal layer may be composed of two or more these materials. The metal layer may be omitted depending on the adhesion between the conductive layer 17 and the (1-α) (Bi, Na, Ba) $TiO_3$-α$BiQO_3$ layer 15.

The piezoelectric film ic shown in FIG. 1C can be manufactured by forming the (1-α) (Bi, Na, Ba) $TiO_3$-α$BiQO_3$ layer 15 and the conductive layer 17 on the $Na_xLa_{1-x+y}Ni_{1-y}O_{3-x}$ layer 13 in this order. The conductive layer 17 can be formed by a thin film formation technique such as sputtering, PLD, CVD, sol-gel processing, or AD.

Figure 1D:
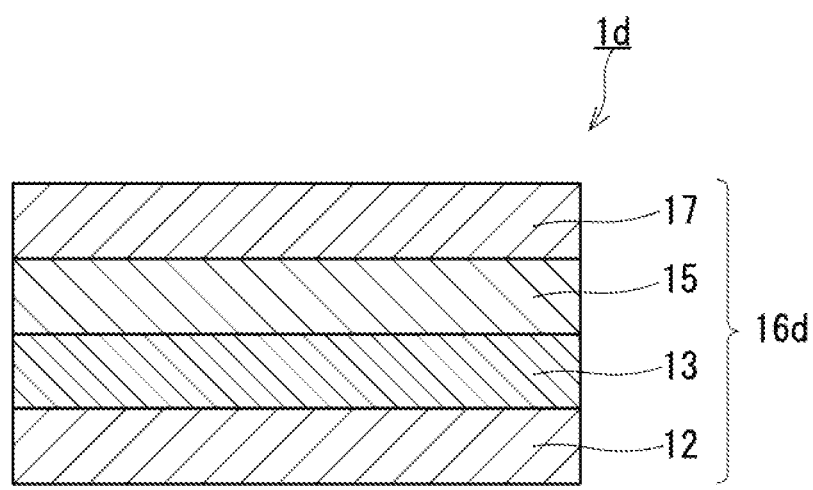
FIG. 1D shows a variation of the piezoelectric film shown in FIG. 1A.

FIG. 1D shows further still another example of the piezoelectric film of the present invention. A piezoelectric film 1d shown in FIG. 1D has a multilayer structure 16d. The multilayer structure 16d is a structure in which the multilayer structure 16a shown in FIG. 1A further includes the metal electrode layer 12 and the conductive layer 17. In the multilayer structure 16d, the $Na_xLa_{1-x+y}Ni_{1-y}O_{3-x}$ layer 13 is formed on the metal electrode layer 12. The conductive layer 17 is formed on the (1-α) (Bi, Na, Ba) $TiO_3$-α$BiQO_3$ layer 15. Particularly, the multilayer structure 16d has the metal electrode layer 12, the $Na_xLa_{1-x+y}Ni_{1-y}O_{3-x}$ layer 13, the (1-α) (Bi, Na, Ba) $TiO_3$-α$BiQO_3$ layer 15, and the conductive layer 17 in this order.

The metal electrode layer 12 can serve together with the $Na_xLa_{1-x+y}Ni_{1-y}O_{3-x}$ layer 13 as an electrode layer for applying a voltage to the (1-α) (Bi, Na, Ba) $TiO_3$-a$BiQO_3$ layer 15. In other words, the electrode layer is a laminate of the $Na_xLa_{1-x+y}Ni_{1-y}O_{3-x}$ layer 13 and the metal electrode layer 12. Furthermore, in the piezoelectric film 1d, the (1-α) (Bi, Na, Ba) $TiO_3$-α$BiQO_3$ layer 15 is interposed between the $Na_xLa_{1-x+y}Ni_{1-y}O_{3-x}$ layer 13 and the conductive layer 17. The $Na_xLa_{1-x+y}Ni_{1-y}O_{3-x}$ layer 13 and the conductive layer 17 can serve as the first electrode layer and the second electrode layer, respectively, for applying a voltage to the (1-α) (Bi, Na, Ba) $TiO_3$-α$BiQO_3$ layer 15.

The piezoelectric film 1d shown in FIG. 1D can be manufactured by forming the $Na_xLa_{1-x+y}Ni_{1-y}O_{3-x}$ layer 13, the (1-α) (Bi, Na, Ba) $TiO_3$-α$BiQO_3$ layer 15, and the conductive layer 17 on the metal electrode layer 12 in this order.

Figure 1E:
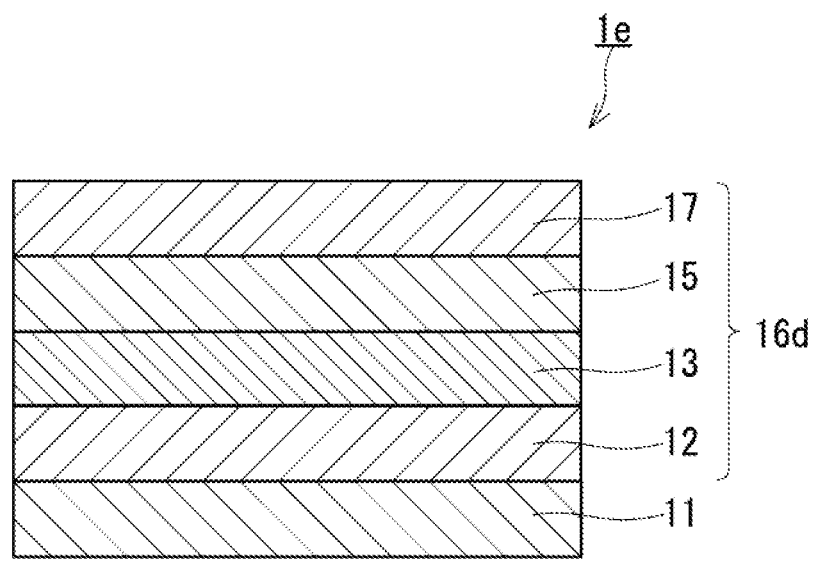
FIG. 1E shows a variation of the piezoelectric film shown in FIG. 1A.

The piezoelectric film may further comprise a substrate 11 as shown in FIG. 1E. The $Na_xLa_{1-x+y}Ni_{1-y}O_{3-x}$ layer 13 is formed through the metal electrode 12 over the substrate 11.

In the piezoelectric film 1e shown in FIG. 1E, the multilayer structure 16d shown in FIG. 1D is formed on the substrate 11.

The substrate 11 may be a silicon substrate. A silicon monocrystalline substrate is desirable.

A metal layer may be disposed between the substrate 11 and the multilayer structure 16d (more particularly, between the substrate 11 and the $Na_xLa_{1-x+y}Ni_{1-y}O_{3-x}$ layer 13) to improve the adhesion therebetween. However, the metal layer needs electric conductivity. An example of the material of the metal layer may be Ti, Ta, Fe, Co, Ni, or Cr. Ti is desirable. Two or more materials may be used for the metal layer. The metal layer can be omitted, depending on the adhesion between the substrate 11 and the multilayer structure 16d.

The piezoelectric film 1e shown in FIG. 1E can be fabricated by forming the metal electrode layer 12, the $Na_xLa_{1-x+y}Ni_{1-y}O_{3-x}$ layer 13, the (1-α) (Bi, Na, Ba) $TiO_3$-a$BiQO_3$ layer 15, and the conductive layer 17 on the substrate 11 in this order.

EXAMPLE

The following example describes the present invention in more detail.

The following example is composed of Experiment A (Q=Fe), Experiment B (Q=Co), Experiment C (Q=$Zn_{0.5}Ti_{0.5}$), and Experiment D (Q=$Mg_{0.5}Ti_{0.5}$).

Experiment A

Q=Fe

Example A1

In the example A1, the piezoelectric film shown in FIG. 1E was fabricated. The value of x, y and a was 0.03, 0.10 and 0.20, respectively. The piezoelectric film was fabricated as below.

A platinum layer having a (111) surface orientation (thickness: 100 nanometers) was formed on a surface of a silicon single monocrystalline substrate having a (100) surface orientation by an RF magnetron sputtering method. This platinum layer served as the metal electrode layer 12.

The condition of the spattering for the platinum layer is described below.

Target: Metal platinum
Atmosphere: Argon gas
RF power: 15 W
Substrate temperature: 300 degrees Celsius Before the platinum layer is formed, a titanium layer (thickness: 2.5 nanometers) was formed on the surface of the silicon single monocrystalline substrate to improve the adhesion between the silicon monocrystalline substrate and the platinum layer. The titanium layer was formed under the condition similar to the condition of the spattering condition for the platinum layer, except that metal titanium was used as a target instead of the metal platinum.

Next, the $Na_xLa_{1-x+y}Ni_{1-y}O_{3-x}$ layer 13 (thickness: 200 nanometers) having a (001) surface orientation was formed on the surface of the platinum layer by an RF magnetron sputtering method.

The condition of the spattering for the $Na_xLa_{1-x+y}Ni_{1-y}O_{3-x}$ layer 13 is described below.

Target: Above-mentioned composition
Atmosphere: Gaseous mixture of argon and oxygen (Flow ratio of Ar/$O_2$: 80/20)
RF power: 100 W
Substrate temperature: 300 degrees Celsius The composition of the formed $Na_xLa_{1-x+y}Ni_{1-y}O_{3-x}$ layer 13 was analyzed by an energy dispersive X-ray analysis method (SEM-EDX) and a wavelength dispersive X-ray micro analyzer (WDS). In the composition analysis, it was difficult to quantify a light element accurately, since the analysis accuracy of the light element such as oxygen (O) was low. However, it was confirmed that the composition of Na, La, and Ni contained in the formed $Na_xLa_{1-x+y}Ni_{1-y}O_{3-x}$ layer 13 was identical to the composition of the target.

Next, the (1-α) (Bi, Na, Ba) $TiO_3$-α$BiFeO_3$ layer 15 (thickness: 2.7 micrometers) was formed on the surface of the $Na_xLa_{1-x+y}Ni_{1-y}O_{3-x}$ layer 13 by an RF magnetron sputtering method. This (1-α) (Bi, Na, Ba) $TiO_3$-α$BiFeO_3$ layer 15 had a composition around MPB.

The condition of the spattering for the (1-α) (Bi, Na, Ba) TiO$_3$-αBiFeO$_3$ layer 15 is described below.

Target: Above-mentioned composition

Atmosphere: Gaseous mixture of argon and oxygen (Flow ratio of Ar/O$_2$: 50/50)

RF power: 170 W

Substrate temperature: 650 degrees Celsius

Figure 2A:
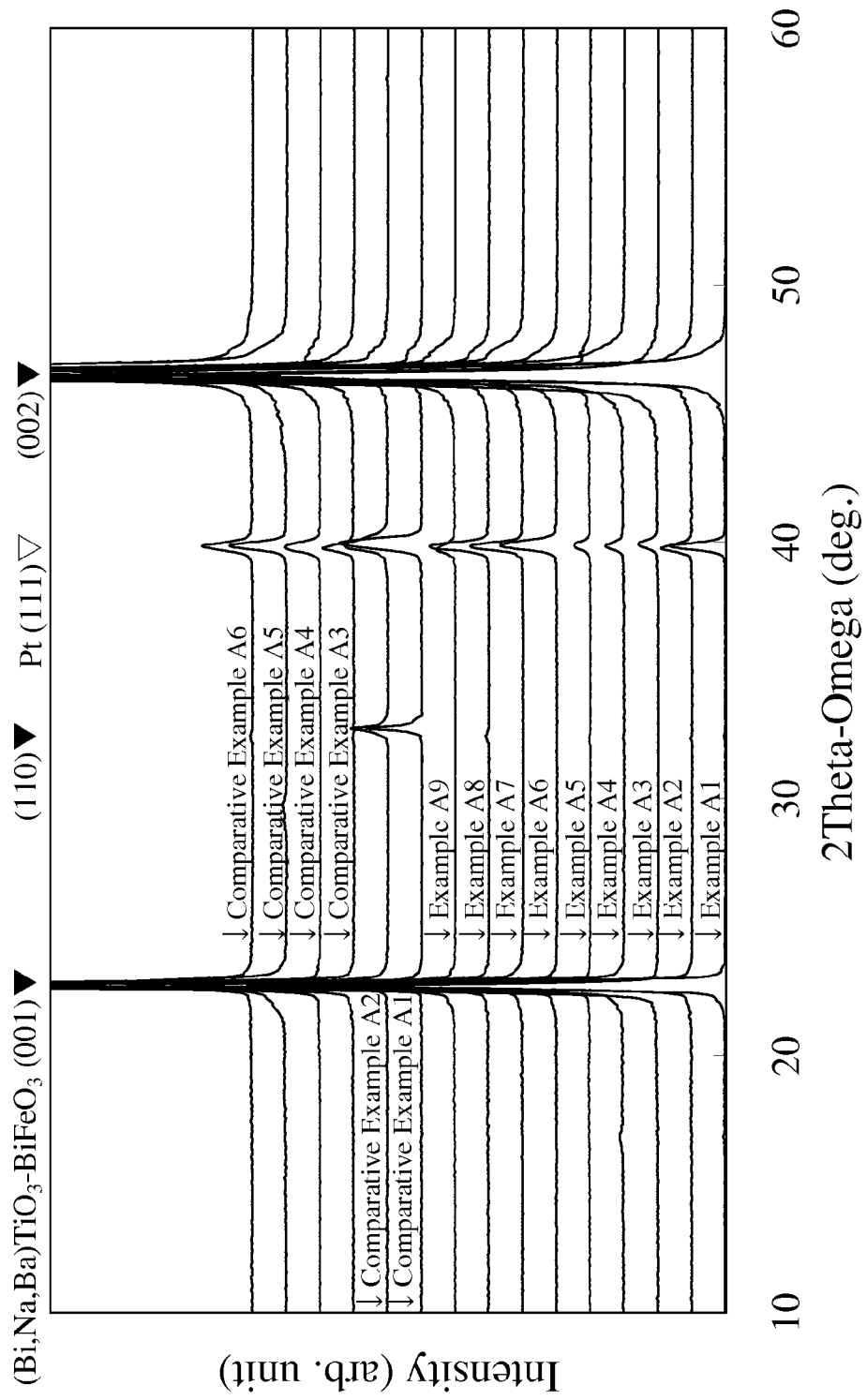
FIG. 2A shows an X-ray diffraction profile of the piezoelectric films according to the examples A1-A9 and the comparative examples A1-A6.
Figure 2B:
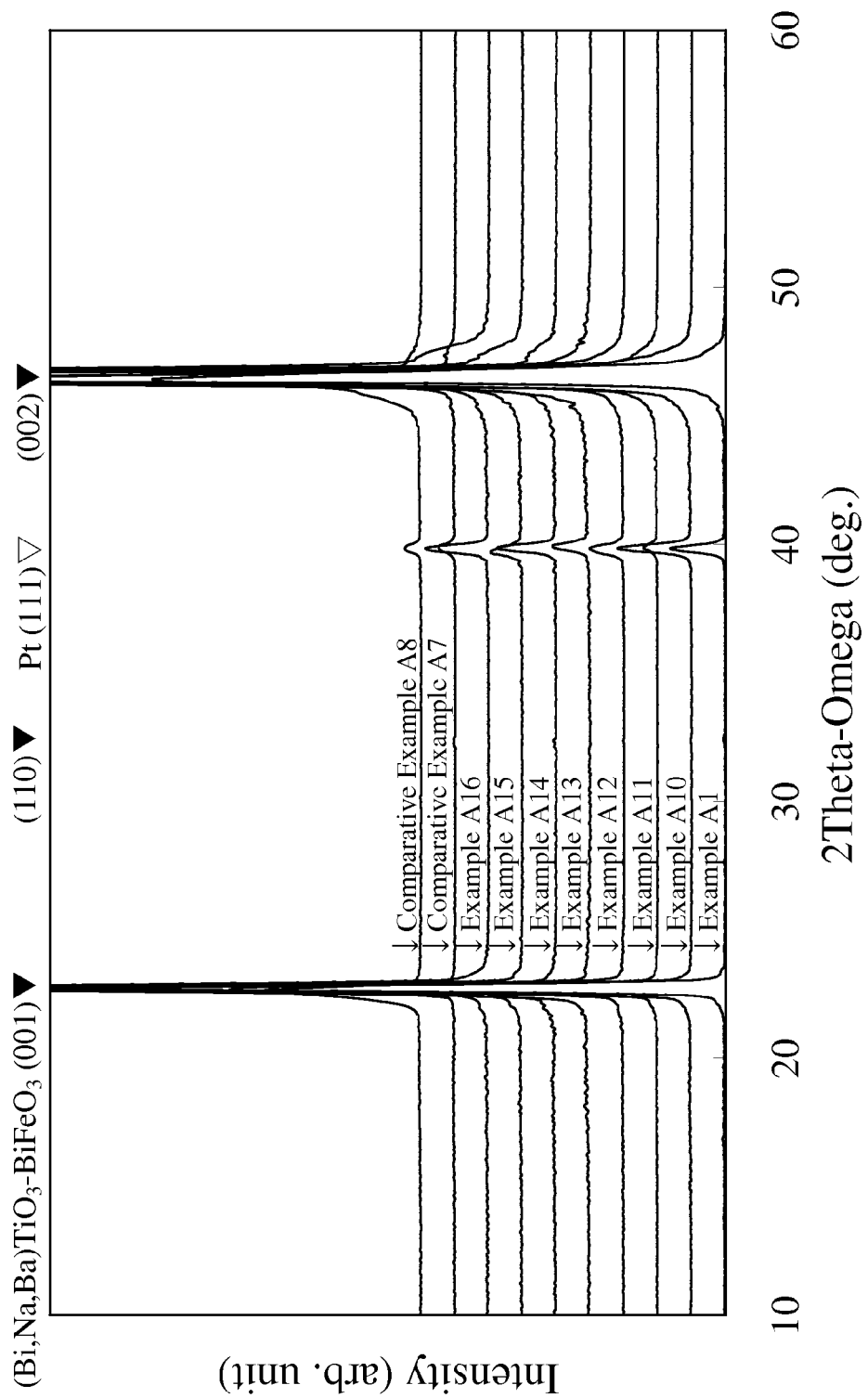
FIG. 2B shows an X-ray diffraction profile of the piezoelectric films according to the example A1, the examples A10-A12, the comparative example A7, and the comparative example A8.
Figure 3A:
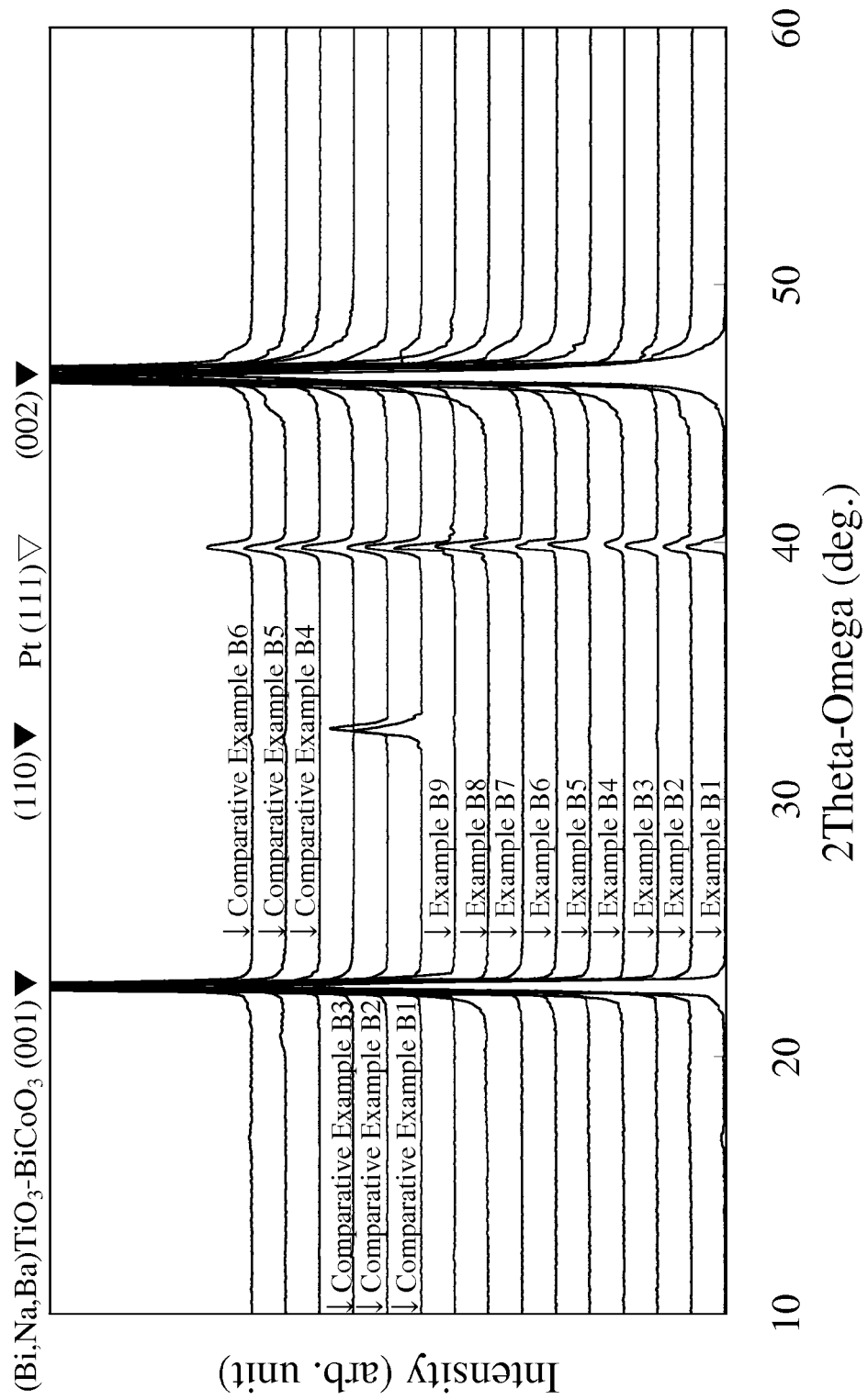
FIG. 3A shows an X-ray diffraction profile of the piezoelectric films according to the examples B1-B9 and the comparative examples B1-B6.
Figure 4B:
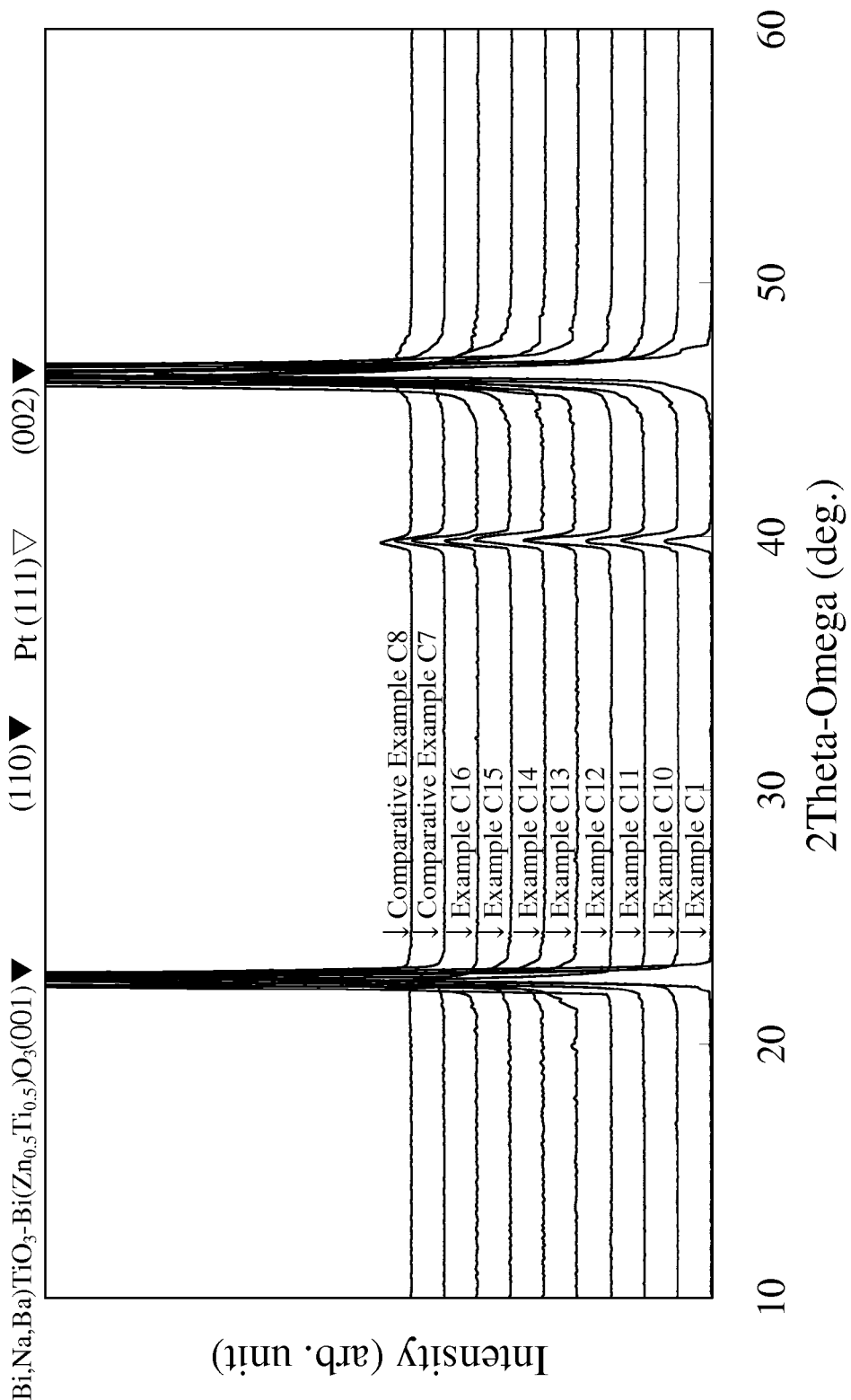
FIG. 4B shows an X-ray diffraction profile of the piezoelectric films according to the example C1, the examples C10-C12, the comparative example C7, and the comparative example C8.
Figure 5C:
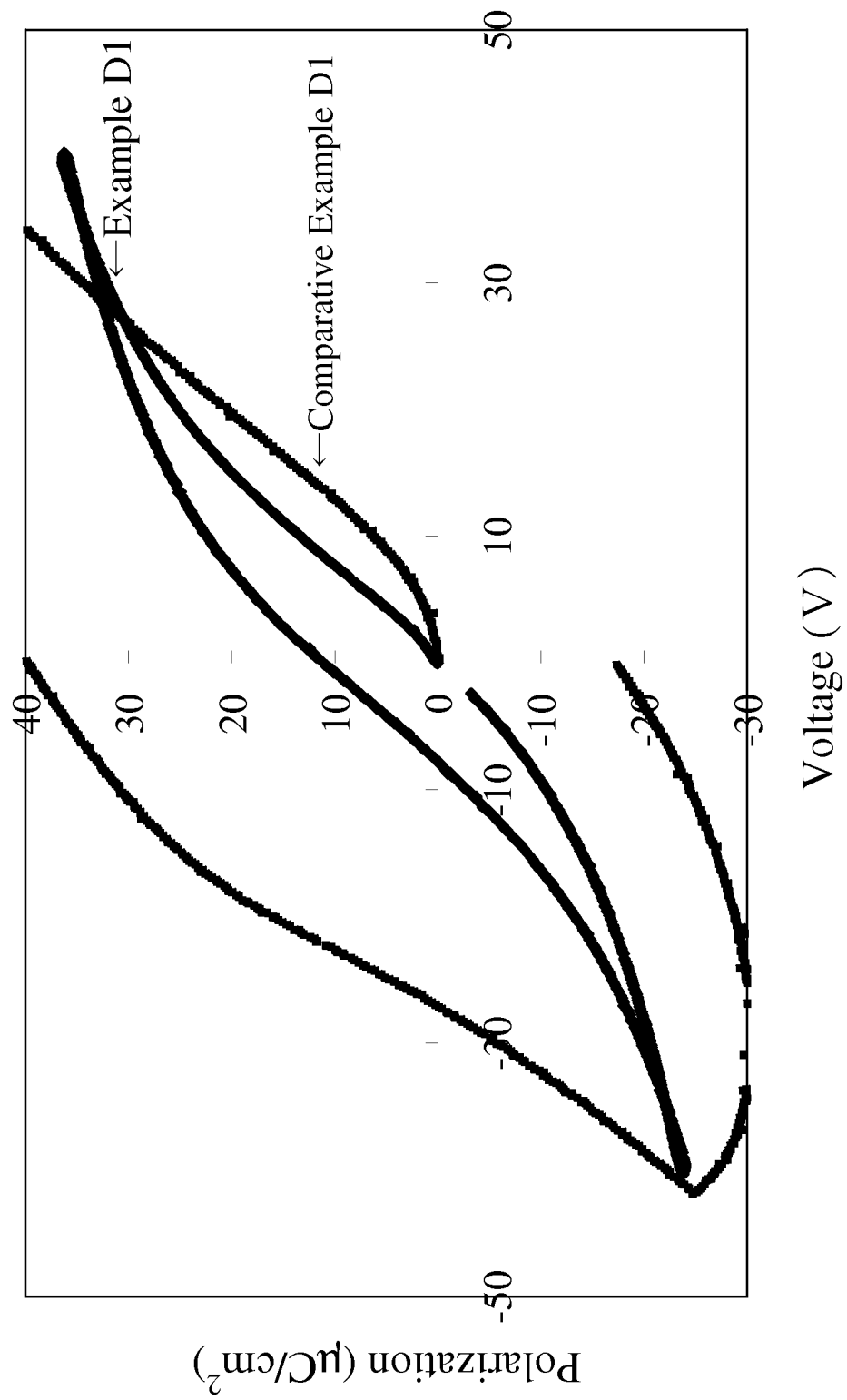
FIG. 5C shows a P-E hysteresis curve of the piezoelectric film according to the example D1 and the comparative example D1.

The formed (1-α) (Bi, Na, Ba) TiO$_3$-αBiFeO$_3$ layer 15 was subjected to an X-ray diffraction analysis to analyze the crystal structure thereof. The X-ray diffraction analysis was carried out in such a manner that an X-ray beam was made incident from over the (1-α) (Bi, Na, Ba) TiO$_3$-αBiFeO$_3$ layer 15. FIG. 2A shows the result thereof. In the following examples and the comparative examples below, X-ray diffraction analyses were carried out in the same manner.

FIG. 2A shows the results of the X-ray diffraction profile. Observed was only the reflection peak derived from the (1-α) (Bi, Na, Ba) TiO$_3$-αBiFeO$_3$ layer 15 having only a (001) surface orientation, except for the reflection peaks derived from the silicon substrate and the platinum layer. The intensity of the (001) reflection peak was 18,431 cps, which was a very high level. The profile shown in FIG. 2A means that the (1-α) (Bi, Na, Ba) TiO$_3$-αBiFeO$_3$ layer 15 according to the example A1 has a significantly high (001) surface orientation.

Subsequently, the half value width of the (001) reflection peak derived from the (1-α) (Bi, Na, Ba) TiO$_3$-αBiFeO$_3$ layer 15 in the obtained X-ray diffraction profile was obtained by rocking curve measurement. The rocking curve measurement is a measurement in which the incident angle ω of the X-ray beam to the sample is scanned while the detector is fixed to the diffraction angle 2θ of the reflection peak to be measured. The obtained half value width corresponds to the degree of tilt of the crystallographic axis in the direction perpendicular to the main surface of the film. The smaller half value width is, the higher crystallinity becomes. As a result, the obtained half value width was a very small value of 2.0°. This means that (1-α) (Bi, Na, Ba) TiO$_3$-αBiQO$_3$ layer 15 layer fabricated in the example A1 has a significantly high crystallinity. In the comparative examples below, the same rocking curve measurement was used to measure the half value widths of the reflection peaks.

Then, a gold layer (thickness: 100 nm) was formed by evaporation on the surface of the (1-α) (Bi, Na, Ba)TiO$_3$-αBiFeO$_3$ layer 15. This gold layer served as the conductive layer 17. In this way, the piezoelectric film according to the example A1 was fabricated.

Using the platinum layer and the gold layer, the ferroelectric performance and the piezoelectric performance of the (1-α) (Bi, Na, Ba) TiO$_3$-αBiFeO$_3$ layer 15 were evaluated. FIG. 2C shows the P-E hysteresis curve of the (1-α) (Bi, Na, Ba) TiO$_3$-αBiFeO$_3$ layer 15 according to the example A1.

As shown in FIG. 2C, it was confirmed that the (1-α) (Bi, Na, Ba) TiO$_3$-αBiFeO$_3$ layer 15 exhibited better ferroelectric performance with an increase in the voltage applied to the (1-α) (Bi, Na, Ba) TiO$_3$-αBiFeO$_3$ layer 15. An impedance analyzer was used to measure the dielectric loss (hereinafter, referred to as "tan δ") at 1 kHz. As a result, the value of tan δ of the (1-α) (Bi, Na, Ba) TiO$_3$-αBiFeO$_3$ layer 15 was 2.4%. This means that the leak current of the (1-α) (Bi, Na, Ba) TiO$_3$-αBiFeO$_3$ layer 15 is small.

The polarization-disappear temperature, namely, the temperature Td, of the (1-α) (Bi, Na, Ba) TiO$_3$-αBiFeO$_3$ layer 15 was measured as below.

The (1-α) (Bi, Na, Ba) TiO$_3$-αBiFeO$_3$ layer 15 was set in a thermostatic oven. The P-E hysteresis curve of the (1-α) (Bi, Na, Ba) TiO$_3$-αBiFeO$_3$ layer 15 was measured with an increase in a temperature.

The temperature Td was measured in accordance with Journal of the American Ceramic Society 93 [4](2010) 1108-1113

The temperature Td of the (1-α) (Bi, Na, Ba) TiO$_3$-αBiFeO$_3$ layer 15 according to the example A1 was a high value of 185 degrees Celsius. This means that the piezoelectric performance of the (1-α) (Bi, Na, Ba) TiO$_3$-αBiFeO$_3$ layer 15 is maintained under a solder reflow temperature (180 degrees Celsius).

The piezoelectric performance of the (1-α) (Bi, Na, Ba) TiO$_3$-αBiFeO$_3$ layer 15 was evaluated in the following manner. The (1-α) (Bi, Na, Ba) TiO$_3$-αBiFeO$_3$ layer 15 was cut into a strip with a width of 2 mm and worked into a cantilever shape. A potential difference was applied between the platinum layer and the gold layer, and the resulting displacement of the cantilever was measured with a laser displacement meter. The measured displacement was converted into a piezoelectric constant d$_{31}$ to evaluate the piezoelectric performance.

These results are shown in Table 1 and Table 2.

Then, the measured displacement amount was converted into the piezoelectric constant d$_{31}$. The piezoelectric constant d$_{31}$ (3 volts/micrometer) of the (1-α) (Bi, Na, Ba) TiO$_3$-αBiFeO$_3$ layer 15 according to the example A1 was −81 pC/N, when a low electric field (3 volts/micrometer) was applied.

When a high electric field (10 volts/micrometer) was applied, the piezoelectric constant d$_{31}$ (10 volts/micrometer) of the (1-α) (Bi, Na, Ba) TiO$_3$-αBiFeO$_3$ layer 15 according to the example A1 was −80 pC/N.

The linearity of the (1-α) (Bi, Na, Ba) TiO$_3$-αBiFeO$_3$ layer 15 according to the example A1 was estimated on the basis of the ratio of the piezoelectric constant d31 (3 volts/micrometer) to the piezoelectric constant d$_{31}$ (10 volts/micrometer). In the example 1, this ratio, namely, the value of the piezoelectric constant d$_{31}$ (3 volts/micrometer)/the piezoelectric constant d$_{31}$ (10 volts/micrometer), was 1.01. This means that the amount of the displacement was proportional to the applied electric field.

Example A2

The example similar to the example A1 was conducted, except that x=0.01. The results are shown in Table 1 and Table 2.

Example A3

The example similar to the example A1 was conducted, except that x=0.05. The results are shown in Table 1 and Table 2.

Example A4

The example similar to the example A1 was conducted, except that x=0.03 and y=0.05. The results are shown in Table 1 and Table 2.

Example A5

The example similar to the example A1 was conducted, except that x=0.03 and y=0.20. The results are shown in Table 1 and Table 2.

Example A6

The example similar to the example A1 was conducted, except that x=0.01 and y=0.05. The results are shown in Table 1 and Table 2.

Example A7

The example similar to the example A1 was conducted, except that x=0.01 and y=0.20. The results are shown in Table 1 and Table 2.

Example A8

The example similar to the example A1 was conducted, except that x=0.05 and y=0.05. The results are shown in Table 1 and Table 2.

Example A9

The example similar to the example A1 was conducted, except that x=0.05 and y=0.20. The results are shown in Table 1 and Table 2.

Example A10

The example similar to the example A1 was conducted, except that $\alpha$=0.30. The results are shown in Table 1 and Table 2.

Example A11

The example similar to the example A1 was conducted, except that $\alpha$=0.40. The results are shown in Table 1 and Table 2.

Example A12

The example similar to the example A1 was conducted, except that $\alpha$=0.50. The results are shown in Table 1 and Table 2.

Example A13

The example similar to the example A1 was conducted, except that x=0.01, y=0.05 and, $\alpha$=0.50. The results are shown in Table 1 and Table 2.

Example A14

The example similar to the example A1 was conducted, except that x=0.01, y=0.20 and, $\alpha$=0.50. The results are shown in Table 1 and Table 2.

Example A15

The example similar to the example A1 was conducted, except that x=0.05, y=0.05 and, $\alpha$=0.50. The results are shown in Table 1 and Table 2.

Example A16

The example similar to the example A1 was conducted, except that x=0.05, y=0.20 and, $\alpha$=0.50. The results are shown in Table 1 and Table 2.

Comparative Example A1

The example similar to the example A1 was conducted, except that x=0.0 and y=0.0.

Similarly, the present inventors tried the evaluation of the ferroelectric performance and the piezoelectric performance of the $(1-\alpha)$ (Bi, Na, Ba) $TiO_3$-$\alpha BiFeO_3$ layer 15 in the comparative example A1. However, it was difficult to measure the P-E hysteresis curve accurately, since the leak current in the piezoelectric film was too high (see FIG. 2C).

The $(1-\alpha)$ (Bi, Na, Ba) $TiO_3$-$\alpha BiFeO_3$ layer 15 according to the comparative example 1 has a tan $\delta$ of 38%. It was difficult to measure the accurate temperature Td and the accurate piezoelectric constant $d_{31}$, since the $(1-\alpha)$ (Bi, Na, Ba) $TiO_3$-$\alpha BiFeO_3$ layer 15 according to the comparative example A1 had such a high leak current. The estimated temperature Td was approximately 151 degrees Celsius. The estimated piezoelectric constants at the low electric field (3 volts/micrometer) and at the high electric field (10 volts/micrometer) were approximately −16 pC/N and −30 pC/N, respectively.

Comparative Example A2

The example similar to the example A1 was conducted, except that x=0.03 and y=0.0.

The reflection peak derived from the $(1-\alpha)$ (Bi, Na, Ba) $TiO_3$-$\alpha BiFeO_3$ layer 15 having a (001) surface orientation was also observed in the comparative example 2. However, another reflection peak derived from another crystalline orientation (110) in the $(1-\alpha)$ (Bi, Na, Ba) $TiO_3$-$\alpha BiFeO_3$ layer 15 was also observed.

The ratio of $d_{31}$ (3 volts/micrometer)/$d_{31}$ (10 volts/micrometer) was 0.66. The amount of the displacement was not proportional to the applied electric field.

Comparative Example A3

The example similar to the example A1 was conducted, except that x=0.0 and y=0.10.

Comparative Example A4

The example similar to the example A1 was conducted, except that x=0.08 and y=0.10.

Comparative Example A5

The example similar to the example 1 was conducted, except that x=0.03 and y=0.01.

Comparative Example A6

The example similar to the example 1 was conducted, except that x=0.03 and y=0.25.

Comparative Example A7

The example similar to the example 1 was conducted, except that $\alpha$=0.10.

Comparative Example A8

The example similar to the example 1 was conducted, except that $\alpha$=0.60.

TABLE 1

|  | x | y | α | Orientation direction | (001) Peak Intensity (cps) | Half value width (degree) |
|---|---|---|---|---|---|---|
| Example A1 | 0.03 | 0.10 | 0.20 | only (001) | 18,431 | 2.0 |
| Example A2 | 0.01 | 0.10 | 0.20 | only (001) | 11,616 | 2.4 |
| Example A3 | 0.05 | 0.10 | 0.20 | only (001) | 13,293 | 2.3 |
| Example A4 | 0.03 | 0.05 | 0.20 | only (001) | 12,170 | 2.4 |
| Example A5 | 0.03 | 0.20 | 0.20 | only (001) | 10,080 | 2.5 |
| Example A6 | 0.01 | 0.05 | 0.20 | only (001) | 9,197 | 2.8 |
| Example A7 | 0.01 | 0.20 | 0.20 | only (001) | 8,737 | 2.6 |
| Example A8 | 0.05 | 0.05 | 0.20 | only (001) | 9,241 | 2.7 |
| Example A9 | 0.05 | 0.20 | 0.20 | only (001) | 9,030 | 2.1 |
| Example A10 | 0.03 | 0.10 | 0.30 | only (001) | 17,565 | 2.4 |
| Example A11 | 0.03 | 0.10 | 0.40 | only (001) | 16,604 | 2.3 |
| Example A12 | 0.03 | 0.10 | 0.50 | only (001) | 14,664 | 2.1 |
| Example A13 | 0.01 | 0.05 | 0.50 | only (001) | 8,155 | 2.8 |
| Example A14 | 0.01 | 0.20 | 0.50 | only (001) | 8,031 | 2.9 |
| Example A15 | 0.05 | 0.05 | 0.50 | only (001) | 8,509 | 2.7 |
| Example A16 | 0.05 | 0.20 | 0.50 | only (001) | 8,078 | 2.8 |
| Comparative example A1 | 0 | 0 | 0.20 | (001) and (110) | 1,864 | 3.3 |
| Comparative example A2 | 0.03 | 0 | 0.20 | (001) and (110) | 2,030 | 3.2 |
| Comparative example A3 | 0 | 0.10 | 0.20 | only (001) | 6,249 | 2.8 |
| Comparative example A4 | 0.08 | 0.10 | 0.20 | only (001) | 4,048 | 3.1 |
| Comparative example A5 | 0.03 | 0.01 | 0.20 | only (001) | 5,057 | 3.2 |
| Comparative example A6 | 0.03 | 0.25 | 0.20 | only (001) | 5,361 | 3.0 |
| Comparative example A7 | 0.03 | 0.10 | 0.10 | only (001) | 8,377 | 2.7 |
| Comparative example A8 | 0.03 | 0.10 | 0.60 | only (001) | 5,036 | 3.1 |

TABLE 2

|  | Dielectric loss (tan δ) | Polarization-disappear temperature Td (degree Celsius) | $d_{31}$ (3 volts/micrometer) | $d_{31}$ (10 volts/micrometer) | $d_{31}$ (3 volts/micrometer)/ $d_{31}$ (10 volts/micrometer) |
|---|---|---|---|---|---|
| Example A1 | 2.4% | 185 | −81 pC/N | −80 pC/N | 1.01 |
| Example A2 | 3.8% | 183 | −74 | −78 | 0.95 |
| Example A3 | 4.2% | 184 | −84 | −79 | 1.06 |
| Example A4 | 3.6% | 184 | −73 | −78 | 0.93 |
| Example A5 | 4.0% | 182 | −75 | −77 | 0.97 |
| Example A6 | 4.5% | 181 | −70 | −76 | 0.92 |
| Example A7 | 4.6% | 180 | −72 | −75 | 0.96 |
| Example A8 | 4.3% | 183 | −72 | −75 | 0.96 |
| Example A9 | 4.5% | 182 | −78 | −76 | 1.03 |
| Example A10 | 2.8% | 206 | −78 | −78 | 1.00 |
| Example A11 | 3.2% | 223 | −74 | −75 | 0.98 |
| Example A12 | 3.4% | 241 | −71 | −73 | 0.97 |
| Example A13 | 5.0% | 235 | −67 | −70 | 0.95 |
| Example A14 | 5.2% | 236 | −68 | −70 | 0.97 |
| Example A15 | 4.8% | 239 | −70 | −71 | 0.98 |
| Example A16 | 5.0% | 240 | −69 | −70 | 0.99 |
| Comparative example A1 | 38% | 151 | −16 | −30 | 0.53 |
| Comparative example A2 | 35% | 155 | −21 | −32 | 0.66 |
| Comparative example A3 | 15% | 156 | −24 | −38 | 0.62 |
| Comparative example A4 | 20% | 153 | −18 | −30 | 0.61 |
| Comparative example A5 | 17% | 158 | −28 | −39 | 0.73 |
| Comparative example A6 | 16% | 160 | −28 | −40 | 0.70 |
| Comparative example A7 | 11% | 130 | −39 | −55 | 0.71 |
| Comparative example A8 | 19% | 175 | −20 | −34 | 0.60 |

As is clear from Table 1 and Table 2, the $(1-\alpha)$ (Bi, Na, Ba)TiO$_3$-$\alpha$BiFeO$_3$ layer 15 having only a (001) surface orientation formed on the Na$_x$La$_{1-x+y}$Ni$_{1-y}$O$_{3-x}$ layer 13 having a (001) surface orientation ($0.01 \leq x \leq 0.05$, $0.05 \leq y \leq 0.20$, and $0.20 \leq \alpha \leq 0.50$) has high crystalline orientation, the low dielectric loss, the high polarization-disappear temperature, the high piezoelectric constant and the high linearity.

As is clear from the example A2, the example A6, the example A7, the example A13, the example A14, the comparative example A1, and the comparative example A3, it is necessary that the value of x is 0.01 or more.

As is clear from the example A3, the example A8, the example A9, the example A15, the example A16, the comparative example A4, it is necessary that the value of x is 0.05 or less.

As is clear from the example A4, the example A6, the example A13, the example A15, the comparative example A1, the comparative example A2, and the comparative example A5, it is necessary that the value of y is 0.05 or more.

As is clear from the example A5, the example A7, the example A9, the example A14, the example A16, the comparative example A6, it is necessary that the value of y is 0.20 or less.

As is clear from the examples A1-A9 and the comparative example A7, it is necessary that the value of $\alpha$ is 0.20 or more.

As is clear from the examples A12-A16 and the comparative example A8, it is necessary that the value of $\alpha$ is 0.50 or less.

Experiment B

Q=Co

The experiment similar to the experiment A was conducted, except that Co was used as Q instead of Fe.

Table 3 and Table 4 show the results.

TABLE 3

| | x | y | α | Orientation direction | (001) Peak intensity (cps) | half value width (degree) |
|---|---|---|---|---|---|---|
| Example B1 | 0.03 | 0.10 | 0.20 | only (001) | 17,885 | 2.2 |
| Example B2 | 0.01 | 0.10 | 0.20 | only (001) | 11,621 | 2.6 |
| Example B3 | 0.05 | 0.10 | 0.20 | only (001) | 12,498 | 2.5 |
| Example B4 | 0.03 | 0.05 | 0.20 | only (001) | 11,849 | 2.6 |
| Example B5 | 0.03 | 0.20 | 0.20 | only (001) | 10,053 | 2.9 |
| Example B6 | 0.01 | 0.05 | 0.20 | only (001) | 8,963 | 3.2 |
| Example B7 | 0.01 | 0.20 | 0.20 | only (001) | 8,477 | 2.9 |
| Example B8 | 0.05 | 0.05 | 0.20 | only (001) | 9,091 | 3.0 |
| Example B9 | 0.05 | 0.20 | 0.20 | only (001) | 9,141 | 2.2 |
| Example B10 | 0.03 | 0.10 | 0.30 | only (001) | 17,321 | 2.6 |
| Example B11 | 0.03 | 0.10 | 0.40 | only (001) | 16,751 | 2.5 |
| Example B12 | 0.03 | 0.10 | 0.50 | only (001) | 14,370 | 2.3 |
| Example B13 | 0.01 | 0.05 | 0.50 | only (001) | 7,995 | 3.2 |
| Example B14 | 0.01 | 0.20 | 0.50 | only (001) | 7,873 | 3.2 |
| Example B15 | 0.05 | 0.05 | 0.50 | only (001) | 8,382 | 3.0 |
| Example B16 | 0.05 | 0.20 | 0.50 | only (001) | 7,964 | 3.0 |
| Comparative example B1 | 0 | 0 | 0.20 | (001) and (110) | 1,819 | 3.5 |
| Comparative example B2 | 0.03 | 0 | 0.20 | (001) and (110) | 1,996 | 3.6 |
| Comparative example B3 | 0 | 0.10 | 0.20 | only (001) | 6,063 | 3.1 |
| Comparative example B4 | 0.08 | 0.10 | 0.20 | only (001) | 3,962 | 3.3 |
| Comparative example B5 | 0.03 | 0.01 | 0.20 | only (001) | 4,915 | 3.5 |
| Comparative example B6 | 0.03 | 0.25 | 0.20 | only (001) | 5,201 | 3.2 |
| Comparative example B7 | 0.03 | 0.10 | 0.10 | only (001) | 8,210 | 3.0 |
| Comparative example B8 | 0.03 | 0.10 | 0.60 | only (001) | 4,953 | 3.2 |

TABLE 4

| | Dielectric loss (tan δ) | Polarization-disappear temperature Td (degree Celsius) | d31 (3 volts/μm) | d31 (10 volts/μm) | d31 (3 volts/μm)/ d31 (10 volts/μm) |
|---|---|---|---|---|---|
| Example B1 | 2.8% | 188 | −79pC/N | −79pC/N | 1.00 |
| Example B2 | 4.1% | 186 | −72 | −77 | 0.94 |
| Example B3 | 4.5% | 186 | −79 | −78 | 1.01 |
| Example B4 | 3.9% | 187 | −70 | −76 | 0.92 |
| Example B5 | 4.3% | 186 | −72 | −77 | 0.94 |
| Example B6 | 4.8% | 184 | −68 | −75 | 0.91 |
| Example B7 | 4.7% | 182 | −67 | −73 | 0.92 |
| Example B8 | 4.5% | 185 | −66 | −72 | 0.92 |
| Example B9 | 4.8% | 184 | −73 | −74 | 0.99 |
| Example B10 | 3.2% | 210 | −75 | −77 | 0.97 |
| Example B11 | 3.5% | 227 | −72 | −74 | 0.97 |
| Example B12 | 3.9% | 248 | −67 | −71 | 0.94 |
| Example B13 | 5.3% | 236 | −63 | −69 | 0.91 |
| Example B14 | 5.5% | 238 | −65 | −68 | 0.96 |
| Example B15 | 5.3% | 242 | −67 | −70 | 0.96 |
| Example B16 | 5.2% | 243 | −66 | −68 | 0.97 |
| Comparative example B1 | 46% | 152 | −14 | −28 | 0.50 |
| Comparative example B2 | 38% | 156 | −20 | −31 | 0.65 |
| Comparative example B3 | 17% | 159 | −22 | −37 | 0.59 |
| Comparative example B4 | 26% | 156 | −17 | −29 | 0.59 |
| Comparative example B5 | 21% | 159 | −27 | −38 | 0.71 |
| Comparative example B6 | 17% | 163 | −25 | −37 | 0.68 |
| Comparative example B7 | 15% | 131 | −35 | −52 | 0.67 |

TABLE 4-continued

| | Dielectric loss (tan δ) | Polarization-disappear temperature Td (degree Celsius) | d31 (3 volts/μm) | d31 (10 volts/μm) | d31 (3 volts/μm)/ d31 (10 volts/μm) |
|---|---|---|---|---|---|
| Comparative example B8 | 25% | 177 | −18 | −32 | 0.56 |

Similarly to the case of Table 1 and Table 2, as is clear from Table 3 and Table 4, the $(1-\alpha)$ (Bi, Na, Ba) $TiO_3$-$\alpha BiCoO_3$ layer 15 having only a (001) surface orientation formed on the $Na_xLa_{1-x+y}Ni_{1-y}O_{3-x}$ layer 13 having a (001) surface orientation ($0.01 \leq x \leq 0.05$, $0.05 \leq y \leq 0.20$, and $0.20 \leq \alpha \leq 0.50$) has high crystalline orientation, the low dielectric loss, the high polarization-disappear temperature, the high piezoelectric constant and the high linearity.

Experiment C $$Q = Zn_{0.5}Ti_{0.5}$$

The experiment similar to the experiment A was conducted, except that $Zn_{0.5}Ti_{0.5}$ was used as Q instead of Fe. Table 5 and Table 6 show the results.

TABLE 5

| | x | y | α | Orientation direction | (001) Peak intensity (cps) | half value width (°) |
|---|---|---|---|---|---|---|
| Example C1 | 0.03 | 0.10 | 0.20 | only (001) | 18,187 | 2.1 |
| Example C2 | 0.01 | 0.10 | 0.20 | only (001) | 11,611 | 2.4 |
| Example C3 | 0.05 | 0.10 | 0.20 | only (001) | 12,598 | 2.4 |
| Example C4 | 0.03 | 0.05 | 0.20 | only (001) | 12,160 | 2.5 |
| Example C5 | 0.03 | 0.20 | 0.20 | only (001) | 10,059 | 2.6 |
| Example C6 | 0.01 | 0.05 | 0.20 | only (001) | 9,080 | 3.0 |
| Example C7 | 0.01 | 0.20 | 0.20 | only (001) | 8,615 | 2.7 |
| Example C8 | 0.05 | 0.05 | 0.20 | only (001) | 9,288 | 2.7 |
| Example C9 | 0.05 | 0.20 | 0.20 | only (001) | 9,156 | 2.1 |
| Example C10 | 0.03 | 0.10 | 0.30 | only (001) | 17,342 | 2.5 |
| Example C11 | 0.03 | 0.10 | 0.40 | only (001) | 16,718 | 2.3 |
| Example C12 | 0.03 | 0.10 | 0.50 | only (001) | 14,617 | 2.2 |
| Example C13 | 0.01 | 0.05 | 0.50 | only (001) | 8,098 | 2.9 |
| Example C14 | 0.01 | 0.20 | 0.50 | only (001) | 7,925 | 3.0 |
| Example C15 | 0.05 | 0.05 | 0.50 | only (001) | 8,492 | 2.7 |
| Example C16 | 0.05 | 0.20 | 0.50 | only (001) | 7,901 | 2.9 |
| Comparative example C1 | 0 | 0 | 0.20 | (001) and (110) | 1,851 | 3.4 |
| Comparative example C2 | 0.03 | 0 | 0.20 | (001) and (110) | 2,015 | 3.3 |
| Comparative example C3 | 0 | 0.10 | 0.20 | only (001) | 6,106 | 3.0 |
| Comparative example C4 | 0.08 | 0.10 | 0.20 | only (001) | 4,516 | 3.0 |
| Comparative example C5 | 0.03 | 0.01 | 0.20 | only (001) | 4,968 | 3.3 |
| Comparative example C6 | 0.03 | 0.25 | 0.20 | only (001) | 5,367 | 3.0 |
| Comparative example C7 | 0.03 | 0.10 | 0.10 | only (001) | 8,239 | 2.8 |
| Comparative example C8 | 0.03 | 0.10 | 0.60 | only (001) | 4,953 | 3.2 |

TABLE 6

| | Dielectric loss (tan δ) | Polarization-disappear temperature Td (degree Celsius) | d31 (3 volts/μm) | d31 (10 volts/μm)/ | d31 (3 volts/μm)/ d31 (10 volts/μm) |
|---|---|---|---|---|---|
| Example C1 | 2.1% | 186 | −80pC/N | −80pC/N | 1.00 |
| Example C2 | 3.6% | 184 | −74 | −78 | 0.95 |
| Example C3 | 4.1% | 183 | −81 | −79 | 1.03 |
| Example C4 | 3.5% | 185 | −72 | −77 | 0.94 |
| Example C5 | 3.8% | 183 | −74 | −77 | 0.96 |
| Example C6 | 4.4% | 183 | −70 | −76 | 0.92 |
| Example C7 | 4.4% | 180 | −70 | −74 | 0.95 |
| Example C8 | 4.2% | 182 | −73 | −76 | 0.96 |
| Example C9 | 4.0% | 183 | −78 | −76 | 1.03 |
| Example C10 | 2.6% | 209 | −76 | −77 | 0.99 |
| Example C11 | 3.0% | 225 | −73 | −75 | 0.97 |
| Example C12 | 3.2% | 243 | −68 | −72 | 0.94 |
| Example C13 | 4.8% | 235 | −64 | −69 | 0.93 |
| Example C14 | 4.9% | 236 | −66 | −69 | 0.96 |
| Example C15 | 4.7% | 241 | −68 | −71 | 0.96 |
| Example C16 | 5.0% | 243 | −65 | −68 | 0.96 |
| Comparative example C1 | 37% | 151 | −15 | −29 | 0.52 |
| Comparative example C2 | 33% | 156 | −20 | −31 | 0.65 |
| Comparative example C3 | 14% | 157 | −23 | −38 | 0.61 |
| Comparative example C4 | 15% | 154 | −21 | −32 | 0.66 |
| Comparative example C5 | 16% | 157 | −28 | −39 | 0.72 |
| Comparative example C6 | 15% | 163 | −27 | −39 | 0.69 |

TABLE 6-continued

| | Dielectric loss (tan δ) | Polarization-disappear temperature Td (degree Celsius) | d31 (3 volts/μm) | d31 (10 volts/μm)/ | d31 (3 volts/μm)/ d31 (10 volts/μm) |
|---|---|---|---|---|---|
| Comparative example C7 | 10% | 131 | −36 | −53 | 0.68 |
| Comparative example C8 | 27% | 176 | −19 | −33 | 0.58 |

Similarly to the case of Table 1 and Table 2, as is clear from Table 5 and Table 6, the $(1-\alpha)$ (Bi, Na, Ba) $TiO_3$-$\alpha BiZn_{0.5}Ti_{0.5}O_3$ layer 15 having only a (001) surface orientation formed on the $Na_xLa_{1-x+y}Ni_{1-y}O_{3-x}$ layer 13 having a (001) surface orientation ($0.01 \leq x \leq 0.05$, $0.05 \leq y \leq 0.20$, and $0.20 \leq \alpha \leq 0.50$) has high crystalline orientation, the low dielectric loss, the high polarization-disappear temperature, the high piezoelectric constant and the high linearity.

Experiment D $$Q = Mg_{0.5}Ti_{0.5}$$

The experiment similar to the experiment A was conducted, except that $Mg_{0.5}Ti_{0.5}$ was used as Q instead of Fe. Table 7 and Table 8 show the results.

TABLE 7

| | x | y | α | Orientation direction | (001) Peak intensity (cps) | half value width (°) |
|---|---|---|---|---|---|---|
| Example D1 | 0.03 | 0.10 | 0.20 | only (001) | 18,039 | 2.2 |
| Example D2 | 0.01 | 0.10 | 0.20 | only (001) | 11,585 | 2.4 |
| Example D3 | 0.05 | 0.10 | 0.20 | only (001) | 12,527 | 2.4 |
| Example D4 | 0.03 | 0.05 | 0.20 | only (001) | 12,010 | 2.6 |
| Example D5 | 0.03 | 0.20 | 0.20 | only (001) | 10,008 | 2.7 |
| Example D6 | 0.01 | 0.05 | 0.20 | only (001) | 8,955 | 3.0 |
| Example D7 | 0.01 | 0.20 | 0.20 | only (001) | 8,567 | 2.8 |
| Example D8 | 0.05 | 0.05 | 0.20 | only (001) | 9,123 | 2.7 |
| Example D9 | 0.05 | 0.20 | 0.20 | only (001) | 9,106 | 2.2 |
| Example D10 | 0.03 | 0.10 | 0.30 | only (001) | 17,335 | 2.5 |
| Example D11 | 0.03 | 0.10 | 0.40 | only (001) | 16,709 | 2.3 |
| Example D12 | 0.03 | 0.10 | 0.50 | only (001) | 14,575 | 2.3 |
| Example D13 | 0.01 | 0.05 | 0.50 | only (001) | 7,988 | 2.9 |
| Example D14 | 0.01 | 0.20 | 0.50 | only (001) | 7,906 | 3.1 |
| Example D15 | 0.05 | 0.05 | 0.50 | only (001) | 8,487 | 2.8 |
| Example D16 | 0.05 | 0.20 | 0.50 | only (001) | 7,854 | 2.9 |
| Comparative example D1 | 0 | 0 | 0.20 | (001) and (110) | 1,840 | 3.5 |
| Comparative example D2 | 0.03 | 0 | 0.20 | (001) and (110) | 1,989 | 3.4 |
| Comparative example D3 | 0 | 0.10 | 0.20 | only (001) | 6,098 | 3.1 |
| Comparative example D4 | 0.08 | 0.10 | 0.20 | only (001) | 4,485 | 3.1 |
| Comparative example D5 | 0.03 | 0.01 | 0.20 | only (001) | 4,970 | 3.2 |
| Comparative example D6 | 0.03 | 0.25 | 0.20 | only (001) | 5,401 | 2.9 |
| Comparative example D7 | 0.03 | 0.10 | 0.10 | only (001) | 8,182 | 2.9 |
| Comparative example D8 | 0.03 | 0.10 | 0.60 | only (001) | 4,944 | 3.3 |

TABLE 8

| | Dielectric loss (tan δ) | Polarization-disappear temperature Td (degree Celsius) | d31 (3 volts/μm) | d31 (10 volts/μm) | d31 (3 volts/μm)/ d31 (10 volts/μm) |
|---|---|---|---|---|---|
| Example D1 | 2.2% | 187 | −81pC/N | −79pC/N | 1.02 |
| Example D2 | 3.5% | 185 | −75 | −78 | 0.96 |
| Example D3 | 4.0% | 184 | −81 | −77 | 1.05 |
| Example D4 | 3.4% | 186 | −72 | −76 | 0.95 |
| Example D5 | 3.8% | 185 | −75 | −77 | 0.97 |
| Example D6 | 4.3% | 183 | −70 | −75 | 0.93 |
| Example D7 | 4.4% | 181 | −69 | −72 | 0.96 |
| Example D8 | 4.3% | 185 | −71 | −74 | 0.96 |
| Example D9 | 4.2% | 183 | −77 | −75 | 1.02 |
| Example D10 | 2.5% | 210 | −76 | −77 | 0.99 |
| Example D11 | 3.1% | 226 | −73 | −74 | 0.98 |
| Example D12 | 3.2% | 246 | −67 | −70 | 0.96 |
| Example D13 | 4.7% | 236 | −65 | −69 | 0.94 |
| Example D14 | 4.8% | 237 | −64 | −67 | 0.96 |
| Example D15 | 4.6% | 241 | −69 | −71 | 0.97 |
| Example D16 | 4.9% | 242 | −66 | −67 | 0.98 |
| Comparative example D1 | 38% | 151 | −15 | −28 | 0.52 |
| Comparative example D2 | 32% | 155 | −20 | −30 | 0.66 |
| Comparative example D3 | 15% | 158 | −24 | −38 | 0.63 |
| Comparative example D4 | 15% | 156 | −20 | −31 | 0.63 |
| Comparative example D5 | 17% | 159 | −27 | −38 | 0.72 |

TABLE 8-continued

|  | Dielectric loss (tan δ) | Polarization-disappear temperature Td (degree Celsius) | d31 (3 volts/μm) | d31 (10 volts/μm) | d31 (3 volts/μm)/ d31 (10 volts/μm) |
|---|---|---|---|---|---|
| Comparative example D6 | 15% | 163 | −27 | −38 | 0.71 |
| Comparative example D7 | 12% | 132 | −37 | −53 | 0.70 |
| Comparative example D8 | 28% | 176 | −20 | −33 | 0.60 |

Similarly to the case of Table 1 and Table 2, as is clear from Table 7 and Table 8, the (1-α) (Bi, Na, Ba) TiO$_3$-αBiMg$_{0.5}$Ti$_{0.5}$O$_3$ layer 15 having only a (001) surface orientation formed on the Na$_x$La$_{1-x+y}$Ni$_{1-y}$O$_{3-x}$ layer 13 having a (001) surface orientation (0.01≤x≤0.05, 0.05≤y≤0.20, and 0.20≤α≤0.50) has high crystalline orientation, the low dielectric loss, the high polarization-disappear temperature, the high piezoelectric constant and the high linearity.

A piezoelectric film comprising the (1-α) (Bi, Na, Ba) the TiO$_3$-αBiQO$_3$ layer 15 can be used for an ink jet head, an angular velocity sensor and a piezoelectric power device.

The ink jet head, the angular velocity sensor, and the piezoelectric power generation element each comprising the above-mentioned piezoelectric film are described. For more detail, see International Patent Publication WO2010/047049. U.S. Pat. No. 7,870,787 and Chinese Laid-open patent application publication No. 101981718 are the United States patent publication and the Chinese laid-open patent application publication which are corresponding to International patent publication WO2010/047049, respectively.

(Ink Jet Head)

An ink jet head of the present invention will be described below with reference to FIG. 7 to FIG. 9.

Figure 7:
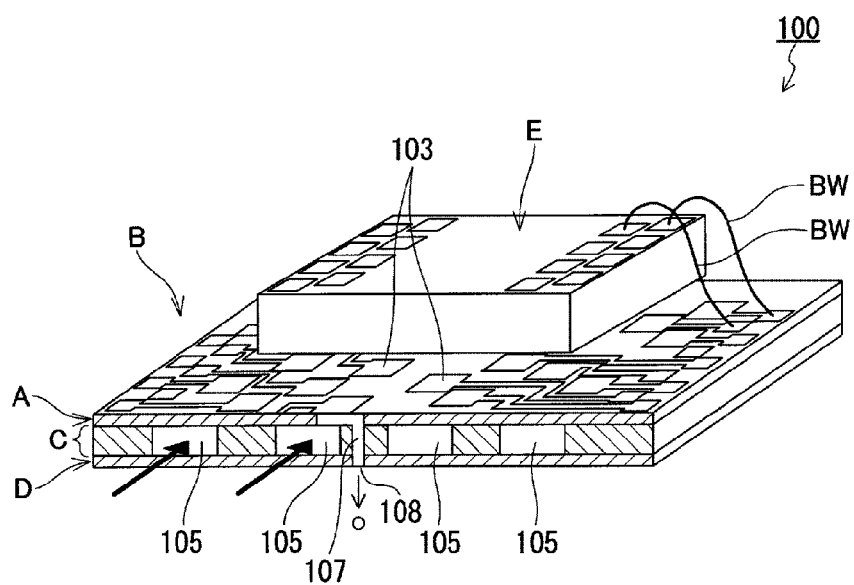
FIG. 7 is a perspective view schematically showing an example of an ink jet head of the present invention and partially showing a cross section of the ink jet head.

FIG. 7 shows one embodiment of the ink jet head of the present invention. FIG. 8 is an exploded view showing main parts including a pressure chamber member and an actuator part in an ink jet head 100 shown in FIG. 7.

Figure 8:
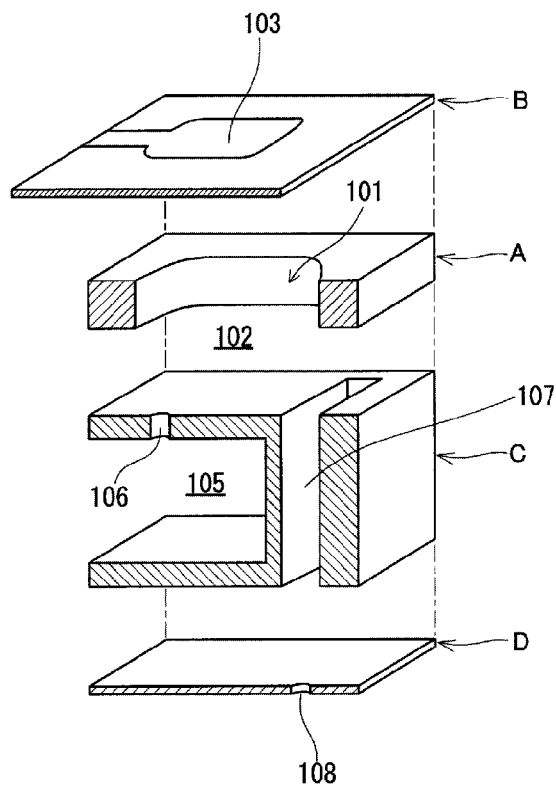
FIG. 8 is an exploded perspective view schematically showing main parts including a pressure chamber member and an actuator part in the ink jet head shown in FIG. 7 and partially showing a cross section of the main parts.

A reference character A in FIG. 7 and FIG. 8 indicates a pressure chamber member. The pressure chamber member A includes through-holes 101 that penetrate therethrough in its thickness direction (in the upward and downward directions in these diagrams). The through-hole 101 shown in FIG. 8 is a part of the through-hole 101 in the cross section in the thickness direction of the pressure chamber member A. A reference character B indicates an actuator part including piezoelectric films and vibration layers. A reference character C indicates an ink passage member C including common liquid chambers 105 and ink passages 107. The pressure chamber member A, the actuator part B, and the ink passage member C are bonded to each other so that the pressure chamber member A is sandwiched between the actuator part B and the ink passage member C. When the pressure chamber member A, the actuator part B, and the ink passage member C are bonded to each other, each of the through-holes 101 forms a pressure chamber 102 for storing ink supplied from the common liquid chamber 105.

The actuator part B has piezoelectric films and vibration layers that are aligned over the corresponding pressure chambers 102 respectively in plan view. In FIG. 7 and FIG. 8, a reference numeral 103 indicates an individual electrode layer that is a part of the piezoelectric film. As shown in FIG. 7, in the ink jet head 100, a plurality of individual electrode layers 103, that is, piezoelectric films are arranged in a zigzag pattern in plan view.

The ink passage member C has the common liquid chambers 105 arranged in stripes in plan view. In FIG. 7 and FIG. 8, each of the common liquid chambers 105 is aligned over a plurality of pressure chambers 102 in plan view. The common liquid chambers 105 extend in the ink supply direction (in the direction indicated by arrows in FIG. 7) in the ink jet head 100. The ink passage member C has supply ports 106, each of which supplies the ink in the common liquid chamber 105 to one of the pressure chambers 102, and ink passages 107, each of which ejects the ink in the corresponding pressure chamber 102 through the corresponding nozzle hole 108. Usually, one pressure chamber 102 has one supply port 106 and one nozzle hole 108. The nozzle holes 108 are formed in a nozzle plate D. The nozzle plate D is bonded to the ink passage member C so that the nozzle plate D and the pressure chamber member A sandwich the ink passage member C therebetween.

In FIG. 7, a reference character E indicates an IC chip. The IC chip E is connected electrically to the individual electrode layers 103, which are exposed on the surface of the actuator part B, through bonding wires BW. For simplicity of FIG. 7, only a part of the bonding wires BW are shown in FIG. 7.

FIG. 8 shows the configuration of the main parts including the pressure chamber member A and the actuator part B. FIG. 9 shows the cross section perpendicular to the ink supply direction (in the direction indicated by the arrows in FIG. 7) in the pressure chamber member A and the actuator part B.

The actuator part B includes piezoelectric films 104 (104a to 104d) each having the piezoelectric layer 15 sandwiched between the first electrode (the individual electrode layer 103) and the second electrode (the common electrode layer 112). The individual electrode layers 103 correspond one to one to the piezoelectric films 104a to 104d. The common electrode layer 112 is a single layer electrode that is common to the piezoelectric films 104a to 104d.

Figure 9:
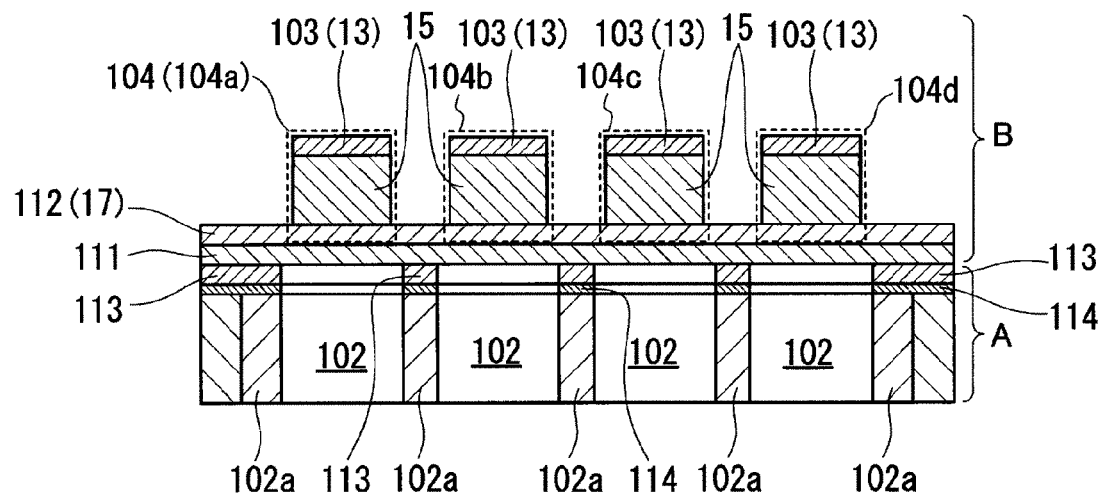
FIG. 9 is a cross-sectional view schematically showing an example of the main parts including the pressure chamber member and the actuator part in the ink jet head shown in FIG. 7.

As surrounded by the dashed-line in FIG. 9, the above-mentioned piezoelectric films 104 are arranged in the ink jet head. The piezoelectric film is the piezoelectric film described in the item titled as "Piezoelectric film".

(Image Forming Method by Ink Jet Head)

The image forming method of the present invention includes, in the above-described ink jet head of the present invention, a step of applying a voltage to the piezoelectric layer through the first and second electrodes (that is, the individual electrode layer and the common electrode layer) to displace, based on the piezoelectric effect, the vibration layer in its film thickness direction so that the volumetric capacity of the pressure chamber changes; and a step of ejecting the ink from the pressure chamber by the displacement.

The voltage to be applied to the piezoelectric layer is changed with the relative position between the ink jet head and an object like a sheet of paper, on which an image is to be formed, being changed, so as to control the timing of ink ejection from the ink jet head and the amount of ink ejected therefrom. As a result, an image is formed on the surface of the object. The term "image" used in the present description includes a character. In other words, according to the present method for forming an image, a letter, a picture, or a figure is printed to a print target such as a sheet of paper. With this method, a picturesque image can be printed.

(Angular Velocity Sensor)

Figure 10:
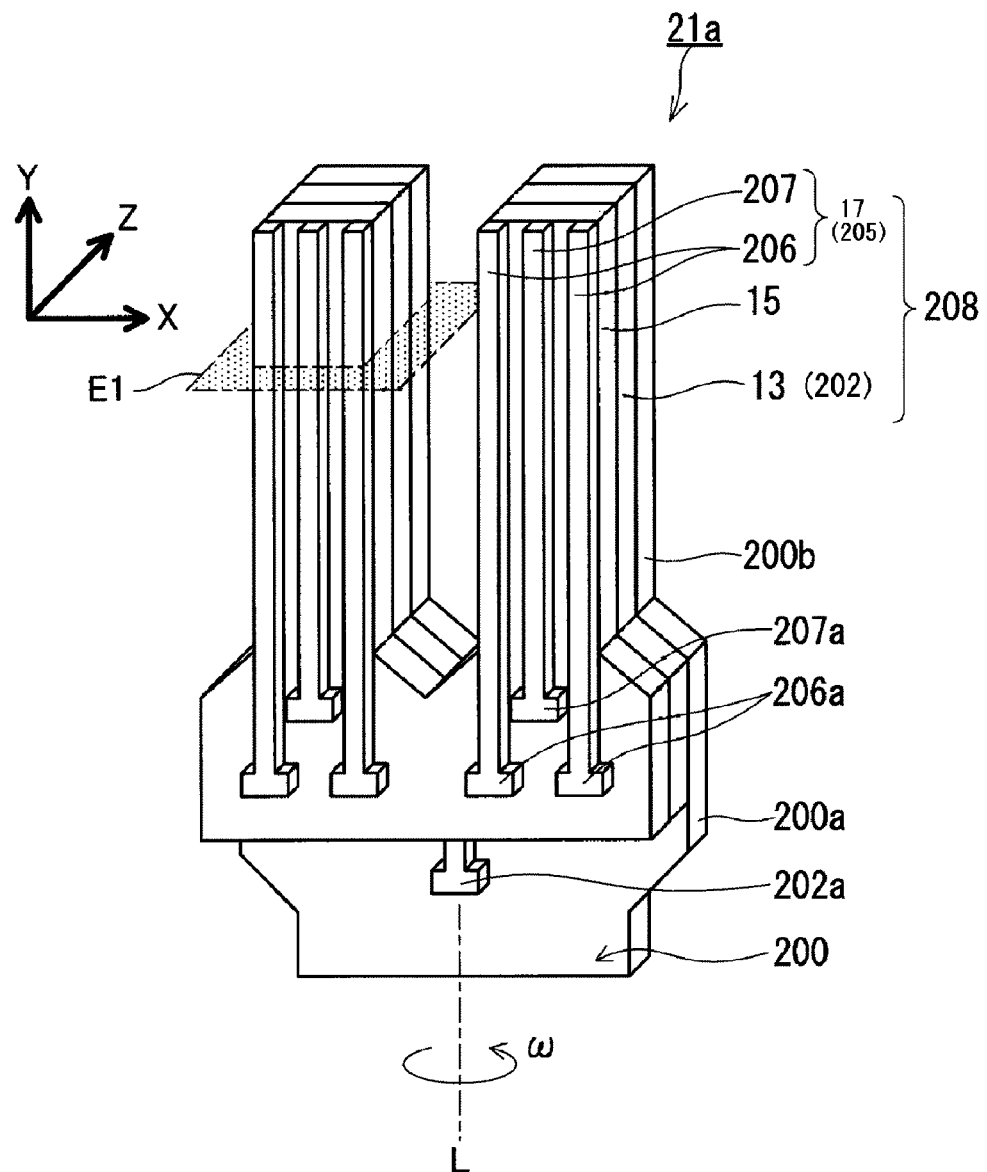
FIG. 10 is a perspective view schematically showing an example of an angular velocity sensor of the present invention.
Figure 11:
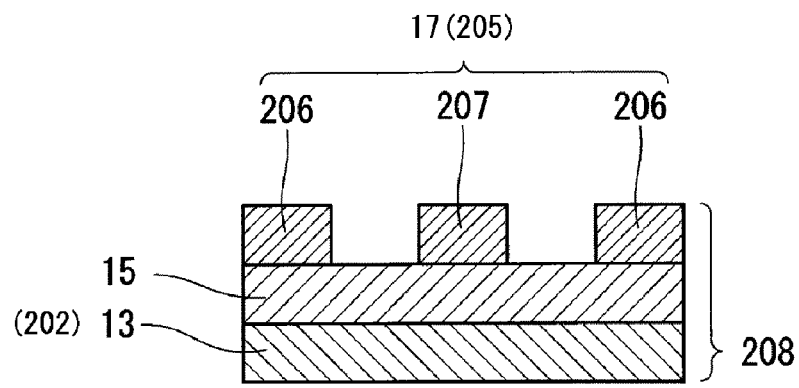
FIG. 11 is a cross-sectional view showing a cross section E1 of the angular velocity sensor shown in FIG. 10.

FIG. 10 shows examples of an angular velocity sensor of the present invention. FIG. 11 shows a cross section E1 of an angular velocity sensor 21a shown in FIG. 10. The angular velocity sensor 21a shown in FIG. 10 is a so-called tuning-fork type angular velocity sensor. This type of angular velocity sensor can be used in a navigation apparatus for a vehicle, and as a sensor for correcting image blurring due to hand movement in a digital still camera.

The angular velocity sensor 21a shown in FIG. 10 includes a substrate 200 having vibration parts 200b and piezoelectric films 208 bonded to the vibration parts 200b.

The substrate 200 has a stationary part 200a and a pair of arms (vibration parts 200b) extending in a predetermined direction from the stationary part 200a. The direction in which the vibration parts 200b extend is the same as the direction in which the central axis of rotation L of the angular velocity detected by the angular velocity sensor 21 extends. Particularly, it is the Y direction in FIG. 9. The substrate 200 has a shape of a tuning fork including two arms (vibration parts 200b), when viewed from the thickness direction of the substrate 200 (the Z direction in FIG. 9).

The material of the substrate 200 is not limited. The material is, for example, Si, glass, ceramic, or metal. A monocrystalline Si substrate can be used as the substrate 200. The thickness of the substrate 200 is not limited as long as the functions of the angular velocity sensor 21a can develop. More particularly, the substrate 200 has a thickness of at least 0.1 mm but not more than 0.8 mm. The thickness of the stationary part 200a can be different from that of the vibration part 200b.

The piezoelectric film 208 is bonded to the vibration part 200b. The piezoelectric film 208 is the piezoelectric layer described in the item titled as "Piezoelectric film". As shown in FIG. 10 and FIG. 11, the piezoelectric film 208 comprises the first electrode 13 (202), the buffer layer 14, the piezoelectric layer 15, and the second electric layer 17 (205).

The second electrode 205 has an electrode group including a drive electrode 206 and a sense electrode 207. The drive electrode 206 applies a driving voltage that oscillates the vibration part 200b to the piezoelectric layer 15. The sense electrode 207 measures a deformation of the vibration part 200b caused by an angular velocity applied to the vibration part 200b. That is, the vibration part 200b usually oscillates in the width direction thereof (the X direction in FIG. 10). More particularly, in the angular velocity sensor shown in FIG. 10, a pair of drive electrodes 206 are provided on both of the width-direction edge portions of the vibration part 200b along the length direction thereof (the Y direction in FIG. 10). Only one drive electrode 206 may be provided on one of the width-direction edge portions of the vibration part 200b. In the angular velocity sensor shown in FIG. 10, the sense electrode 207 is provided along the length direction of the vibration part 200b and sandwiched between the pair of drive electrodes 206. A plurality of sense electrodes 207 may be provided on the vibration part 200b. The deformation of the vibration part 200b measured by the sense electrode 207 usually is a deflection in the thickness direction thereof (the Z direction in FIG. 10).

In the angular velocity sensor of the present invention, one of the first electrode and the second electrode selected therefrom can be composed of an electrode group including the drive electrode and the sense electrode. In the angular velocity sensor 21a shown in FIG. 10, the second electrode 205 is composed of the electrode group. Unlike this angular velocity sensor, the first electrode 202 can be composed of the electrode group.

The first electrode 202, the drive electrode 206, and the sense electrode 207 have connection terminals 202a, 206a, and 207a, respectively, formed at the end portions thereof. The shape and position of each of the connection terminals are not limited. In FIG. 10, the connection terminals are provided on the stationary part 200a.

In the angular velocity sensor shown in FIG. 10, the piezoelectric film 208 is bonded to both the vibration part 200b and the stationary part 200a. The bonding state of the piezoelectric film 208 is not limited as long as the piezoelectric film 208 can oscillate the vibration part 200b and measure the deformation of the vibration part 200b. For example, the piezoelectric film 208 may be bonded only to the vibration part 200b.

The angular velocity sensor of the present invention may have two or more vibration part groups each consisting of a pair of vibration parts 200b. Such an angular velocity sensor can serve as a biaxial or triaxial angular velocity sensor capable of measuring angular velocities with respect to a plurality central axes of rotation. The angular velocity sensor shown in FIG. 10 has one vibration part group consisting of a pair of vibration parts 200b.

(Method of Measuring Angular Velocity by Angular Velocity Sensor)

The angular velocity measuring method of the present invention uses the angular velocity sensor of the present invention, and includes the steps of: applying a driving voltage to the piezoelectric layer to oscillate the vibration part of the substrate; and measuring a deformation of the vibration part caused by an angular velocity applied to the oscillating vibration part to obtain a value of the applied angular velocity. The driving voltage is applied between the drive electrode and one of the first electrode and the second electrode (the other electrode) that serves neither as the drive electrode nor as the sense electrode, and thus the driving voltage is applied to the piezoelectric layer. The sense electrode and the other electrode measure the deformation of the oscillating vibration part caused by the angular velocity.

Hereinafter, the angular velocity measuring method by the angular velocity sensor 21a shown in FIG. 10 is described. A driving voltage having a frequency that resonates with the natural vibration of the vibration part 200b is applied to the piezoelectric layer 15 through the first electrode 202 and the drive electrode 206 so as to oscillate the vibration part 200b. The driving voltage can be applied, for example, by grounding the first electrode 202 and changing the potential of the driving electrode 206 (in other words, the driving voltage is the potential difference between the first electrode 202 and the driving electrode 206). The angular velocity sensor 21a includes a pair of vibration parts 200b that are arranged in the form of the tuning fork. Usually, reverse (positive and negative) voltages are applied to the drive electrodes 206 provided on the respective vibration parts 200b of the pair. This allows the respective vibration parts 200b to oscillate in the mode in which they vibrate in the directions opposite to each other (the mode in which they vibrate symmetrically with respect to the central axis of rotation L shown in FIG. 10). In the angular velocity sensors 21a shown in FIG. 10, the vibration parts 200b oscillate in their width direction (the X direction). The angular velocity can be measured by oscillating only one of the pair of vibration parts 200b. For accurate measurement, however, it is preferable to oscillate both of the vibration parts 200b in the mode in which they vibrate in the directions opposite to each other.

When an angular velocity ω with respect to the central axis of rotation L is applied to the angular velocity sensor 21a in which the vibration parts 200b are oscillating, the vibration parts 200b are deflected respectively in their thickness direction (the Z direction) by Coriolis force. In the case where the respective vibration parts 200b are oscillating in the opposite direction mode, they are deflected in the opposite directions by the same degree. The piezoelectric layer 15 bonded to the vibration part 200b is also deflected according to this deflection of the vibration part 200b. As a result, a potential difference is generated between the first electrode 202 and the sense electrode 207 in accordance with the deflection of the piezoelectric layer 15, that is, the magnitude of the generated Coriolis force. The angular velocity ω applied to the angular velocity sensor 21a can be measured by measuring the magnitude of the potential difference.

The following relationship between a Coriolis force Fc and an angular velocity ω is true:

$$Fc=2mv\omega$$

where v is the velocity of the oscillating vibration part 200b in the oscillation direction, and m is the mass of the vibration part 200b. As shown in this equation, the angular velocity a can be calculated from the Coriolis force Fc.

(Piezoelectric Generating Element)

Figure 12:
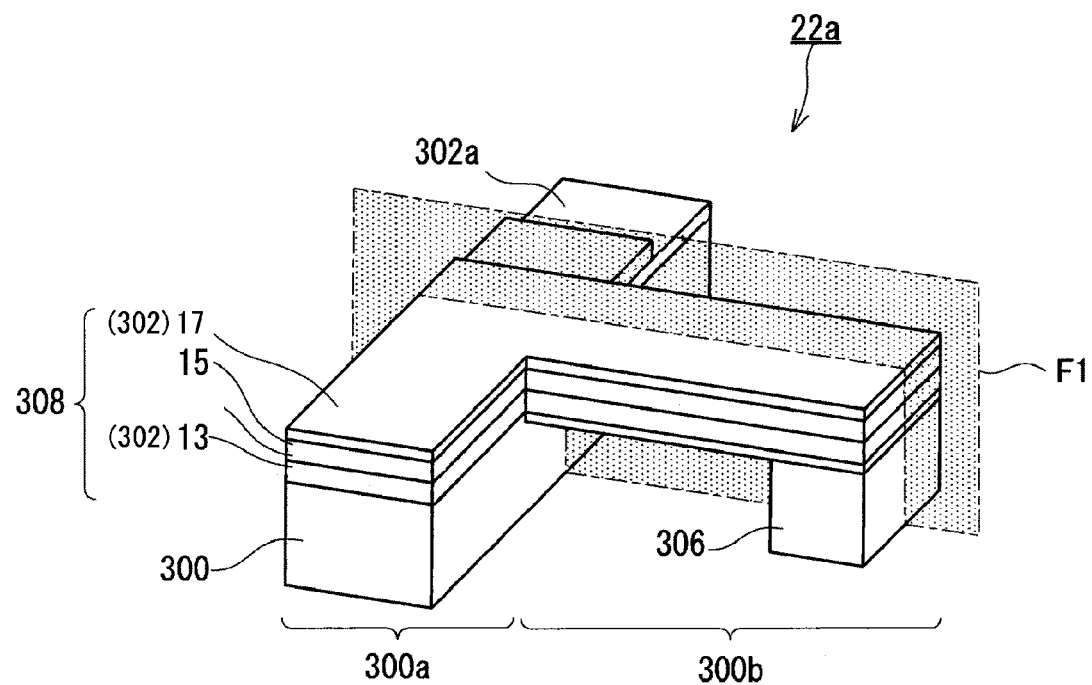
FIG. 12 is a perspective view schematically showing an example of a piezoelectric generating element of the present invention.
Figure 13:
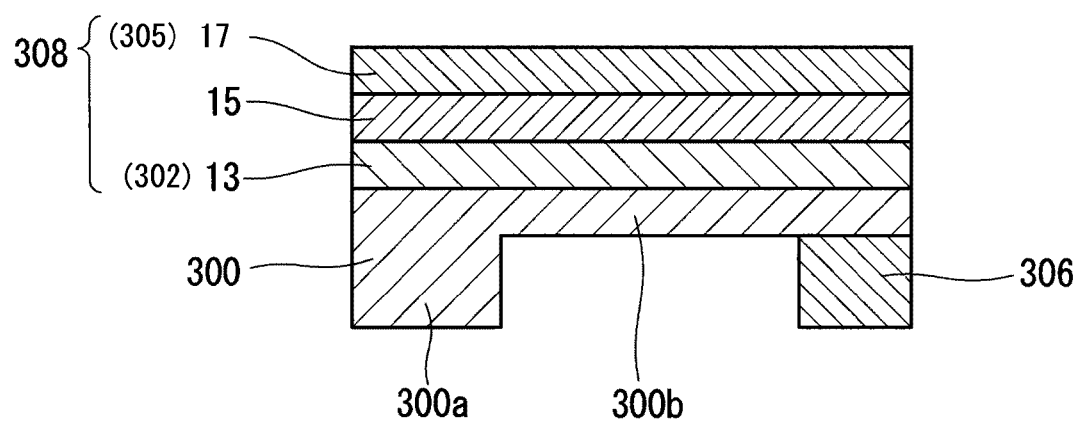
FIG. 13 is a cross-sectional view showing a cross section F1 of the piezoelectric generating element shown in FIG. 12.

FIG. 12 shows an example of the piezoelectric generating element of the present invention. FIG. 13 shows a cross section F1 of a piezoelectric generating element 22a shown in FIG. 12. The piezoelectric generating elements 22a are elements that convert externally-applied mechanical vibration into electrical energy. The piezoelectric generating elements 22a are applied suitably to a self-sustained power supply for generating electric power from various vibrations including engine vibrations and driving vibrations generated in vehicles and machines, and vibrations generated during walking.

The piezoelectric generating element 22a shown in FIG. 12 includes a substrate 300 having a vibration part 300b and a piezoelectric film 308 bonded to the vibration part 300b.

The substrate 300 has a stationary part 300a, and a vibration part 300b having a beam extending in a predetermined direction from the stationary part 300a. The material of the stationary part 300a can be the same as the material of the vibration part 300b. These materials may, however, be different from each other. The stationary part 300a and the vibration part 300b made of materials different from each other may be bonded to each other.

The material of the substrate 300 is not limited. The material is, for example, Si, glass, ceramic, or metal. A monocrystalline Si substrate can be used as the substrate 300. The substrate 300 has a thickness of, for example, at least 0.1 mm but not more than 0.8 mm. The stationary part 300a may have a thickness different from that of the vibration part 300b. The thickness of the vibration part 300b can be adjusted for efficient power generation by changing the resonance frequency of the vibration part 300b.

A weight load 306 is bonded to the vibration part 300b. The weight load 306 adjusts the resonance frequency of the vibration part 300b. The weight load 306 is, for example, a vapor-deposited thin film of Ni. The material, shape, and mass of the weight load 306, as well as the position to which the weight load 306 is bonded can be adjusted according to a desired resonance frequency of the vibration part 300b. The weight load 306 may be omitted. The weight load 306 is not necessary when the resonance frequency of the vibration part 300b is not adjusted.

The piezoelectric film 308 is bonded to the vibration part 300b. The piezoelectric film 308 is the piezoelectric layer described in the item titled as "Piezoelectric film". As shown in FIG. 12 and FIG. 13, the piezoelectric film 308 comprises the first electrode 13 (302), the buffer layer 14, the piezoelectric layer 15, the second electrode 17 (305).

In the piezoelectric generating elements shown in FIG. 12, a part of the first electrode 302 is exposed. This part can serve as a connection terminal 302a.

In the piezoelectric generating element shown in FIG. 12, the piezoelectric film 308 can be bonded to both of the vibration part 300b and the stationary part 300a. The piezoelectric film 308 can be bonded only to the vibration part 300b.

When the piezoelectric generating element of the present invention has a plurality of vibration parts 300b, an increased amount of electric power can be generated. Such a piezoelectric generating element can be applied to mechanical vibrations containing a wide range of frequency components if the plurality of vibration parts 300b have different resonance frequencies.

(Method of Generating Electric Power Using Piezoelectric Generating Element)

The above-described piezoelectric generating element of the present invention is vibrated to obtain electric power through the first electrode and the second electrode.

When mechanical vibration is applied externally to the piezoelectric generating element 22a, the vibration part 300b starts vibrating to produce vertical deflection with respect to the stationary part 300a. The piezoelectric effect produced by this vibration generates an electromotive force across the piezoelectric layer 15. As a result, a potential difference is generated between the first electrode 302 and the second electrode 305 that sandwich the piezoelectric layer 15 therebetween. The higher piezoelectric performance of the piezoelectric layer 15 generates a larger potential difference between the first and second electrodes. Particularly in the case where the resonance frequency of the vibration part 300b is close to the frequency of mechanical vibration to be applied externally to the element, the amplitude of the vibration part 300b increases and thus the electric power generation characteristics are improved. Therefore, the weight load 306 is preferably used to adjust the resonance frequency of the vibration part 300b to be close to the frequency of mechanical vibration applied externally to the element.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

REFERENCE SIGNS LIST

11: substrate
12: metal electrode layer
13: $Na_xLa_{1-x+y}Ni_{1-y}O_{3-x}$ layer (first electrode)
15: $(1-\alpha)$ (Bi, Na, Ba) the $TiO_3-\alpha BiQTi_{0.5})O_3$ layer
17: conductive layer (second electrode)

The invention claimed is:

1. A piezoelectric film comprising:
a $Na_xLa_{1-x+y}Ni_{1-y}O_{3-x}$ layer having only an (001) orientation; and a (1-α) (Bi, Na, Ba) TiO$_3$-αBiQO$_3$ layer having only an (001) orientation; wherein
the (1-α) (Bi, Na, Ba) TiO$_3$-αBiQO$_3$ layer is formed on the Na$_x$La$_{1-x+y}$Ni$_{1-y}$O$_{3-x}$ layer;
Q represents Fe, Co, Zn$_{0.5}$Ti$_{0.5}$, or Mg$_{0.5}$Ti$_{0.5}$;
x represents a value of not less than 0.01 and not more than 0.05;
y represents a value of not less than 0.05 and not more than 0.20; and
α represents a value of not less than 0.20 and not more than 0.50.

2. The piezoelectric film according to claim 1, wherein the (1-α) (Bi, Na, Ba) TiO$_3$-αBiQO$_3$ layer is in contact with the Na$_x$La$_{1-x+y}$Ni$_{1-y}$O$_{3-x}$ layer.

3. The piezoelectric film according to claim 1, wherein the (1-α) (Bi, Na, Ba) TiO$_3$-αBiQO$_3$ layer contains Mn.

4. An ink jet head comprising:
a piezoelectric film having a piezoelectric layer sandwiched between a first electrode and a second electrode;
a vibration layer bonded to the piezoelectric film; and
a pressure chamber member having a pressure chamber for storing ink and bonded to a surface of the vibration layer opposite to a surface to which the piezoelectric film is bonded; wherein
the vibration layer is bonded to the piezoelectric film so that the vibration layer is displaceable in its film thickness direction according to a displacement of the piezoelectric film produced by a piezoelectric effect;
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber;
the first electrode comprises a Na$_x$La$_{1-x+y}$Ni$_{1-y}$O$_{3-x}$ layer having only an (001) orientation;
the piezoelectric layer is a (1-α) (Bi, Na, Ba) TiO$_3$-αBiQO$_3$ layer having only an (001) orientation;
Q represents Fe, Co, Zn$_{0.5}$Ti$_{0.5}$, or Mg$_{0.5}$Ti$_{0.5}$;
x represents a value of not less than 0.01 and not more than 0.05;
y represents a value of not less than 0.05 and not more than 0.20; and
α represents a value of not less than 0.20 and not more than 0.50.

5. The ink jet head according to claim 4, wherein the (1-α) (Bi, Na, Ba) TiO$_3$-αBiQO$_3$ layer is in contact with the Na$_x$La$_{1-x+y}$Ni$_{1-y}$O$_{3-x}$ layer.

6. The ink jet head according to claim 4, wherein the (1-α) (Bi, Na, Ba) TiO$_3$-αBiQO$_3$ layer contains Mn.

7. A method of forming an image by an ink jet head, the method comprising:
a step (a) of preparing the ink jet head, wherein
the ink jet head includes: a piezoelectric film having a piezoelectric layer sandwiched between a first electrode and a second electrode; a vibration layer bonded to the piezoelectric film; and a pressure chamber member having a pressure chamber for storing ink and bonded to a surface of the vibration layer opposite to a surface to which the piezoelectric film is bonded,
the vibration layer is bonded to the piezoelectric film so that the vibration layer is displaceable in its film thickness direction according to a displacement of the piezoelectric film produced by a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber,
the first electrode comprises a Na$_x$La$_{1-x+y}$Ni$_{1-y}$O$_{3-x}$ layer having only an (001) orientation;
the piezoelectric layer is a (1-α) (Bi, Na, Ba) TiO$_3$-αBiQO$_3$ layer having only an (001) orientation;
Q represents Fe, Co, Zn$_{0.5}$Ti$_{0.5}$, or Mg$_{0.5}$Ti$_{0.5}$;
x represents a value of not less than 0.01 and not more than 0.05;
y represents a value of not less than 0.05 and not more than 0.20; and
α represents a value of not less than 0.20 and not more than 0.50; and
a step (b) of applying a voltage to the piezoelectric layer through the first electrode and the second electrode to displace, based on the piezoelectric effect, the vibration layer in its film thickness direction so that the volumetric capacity of the pressure chamber changes and the ink is ejected from the pressure chamber by the displacement.

8. The method according to claim 4, wherein the (1-α) (Bi, Na, Ba) TiO$_3$-αBiQO$_3$ layer is in contact with the Na$_x$La$_{1-x+y}$Ni$_{1-y}$O$_{3-x}$ layer.

9. The method according to claim 4, wherein the (1-α) (Bi, Na, Ba) TiO$_3$-αBiQO$_3$ layer contains Mn.

10. An angular velocity sensor comprising:
a substrate having a vibration part; and
a piezoelectric film bonded to the vibration part and having a piezoelectric layer sandwiched between a first electrode and a second electrode, wherein
the first electrode comprises a Na$_x$La$_{1-x+y}$Ni$_{1-y}$O$_{3-x}$ layer having only an (001) orientation;
the piezoelectric layer is a (1-α) (Bi, Na, Ba) TiO$_3$-αBiQO$_3$ layer having only an (001) orientation;
Q represents Fe, Co, Zn$_{0.5}$Ti$_{0.5}$, or Mg$_{0.5}$Ti$_{0.5}$;
x represents a value of not less than 0.01 and not more than 0.05;
y represents a value of not less than 0.05 and not more than 0.20;
α represents a value of not less than 0.20 and not more than 0.50; and
one of the first electrode and the second electrode selected therefrom is composed of an electrode group including a drive electrode for applying a driving voltage that oscillates the vibration part to the piezoelectric layer and a sense electrode for measuring a displacement of the vibration part caused by an angular velocity applied to the oscillating vibration part.

11. The angular velocity sensor according to claim 10, wherein
the (1-α) (Bi, Na, Ba) TiO$_3$-αBiQO$_3$ layer is in contact with the Na$_x$La$_{1-x+y}$Ni$_{1-y}$O$_{3-x}$ layer.

12. The angular velocity sensor according to claim 10, wherein
the (1-α) (Bi, Na, Ba) TiO$_3$-αBiQO$_3$ layer contains Mn.

13. A method of measuring an angular velocity by an angular velocity sensor, the method comprising:
a step (a) of preparing the angular velocity sensor, wherein
the angular velocity sensor includes: a substrate having a vibration part;
and a piezoelectric film bonded to the vibration part and having a piezoelectric layer sandwiched between a first electrode and a second electrode,
the first electrode comprises a Na$_x$La$_{1-x+y}$Ni$_{1-y}$O$_{3-x}$ layer having only an (001) orientation;
the piezoelectric layer is a (1-α) (Bi, Na, Ba) TiO$_3$-αBiQO$_3$ layer having only an (001) orientation;

Q represents Fe, Co, $Zn_{0.5}Ti_{0.5}$, or $Mg_{0.5}Ti_{0.5}$;

x represents a value of not less than 0.01 and not more than 0.05;

y represents a value of not less than 0.05 and not more than 0.20;

α represents a value of not less than 0.20 and not more than 0.50; and one of the first electrode and the second electrode selected therefrom is composed of an electrode group including a drive electrode and a sense electrode;

a step (b) of applying a driving voltage to the piezoelectric layer through the drive electrode and the other of the first electrode and the second electrode selected therefrom to oscillate the vibration part; and a step (c) of measuring, through the other electrode and the sense electrode, a displacement of the vibration part caused by an angular velocity applied to the oscillating vibration part to obtain a value of the applied angular velocity.

14. The method according to claim 13, wherein
the (1-α) (Bi, Na, Ba) $TiO_3$-α$BiQO_3$ layer is in contact with the $Na_xLa_{1-x+y}Ni_{1-y}O_{3-x}$ layer.

15. The method according to claim 13, wherein
the (1-α) (Bi, Na, Ba) $TiO_3$-α$BiQO_3$ layer contains Mn.

16. A piezoelectric generating element comprising:
a substrate having a vibration part; and
a piezoelectric film bonded to the vibration part and having a piezoelectric layer sandwiched between a first electrode and a second electrode,
wherein
the first electrode comprises a $Na_xLa_{1-x+y}Ni_{1-y}O_{3-x}$ layer having only an (001) orientation;
the piezoelectric layer is a (1-α) (Bi, Na, Ba) $TiO_3$-α$BiQO_3$ layer having only an (001) orientation;
Q represents Fe, Co, $Zn_{0.5}Ti_{0.5}$, or $Mg_{0.5}Ti_{0.5}$;
x represents a value of not less than 0.01 and not more than 0.05;
y represents a value of not less than 0.05 and not more than 0.20; and
α represents a value of not less than 0.20 and not more than 0.50.

17. The piezoelectric generating element according to claim 16, wherein
the (1-α) (Bi, Na, Ba) $TiO_3$-α$BiQO_3$ layer is in contact with the $Na_xLa_{1-x+y}Ni_{1-y}O_{3-x}$ layer.

18. The piezoelectric generating element according to claim 16, wherein
the (1-α) (Bi, Na, Ba) $TiO_3$-α$BiQO_3$ layer contains Mn.

19. A method of generating electric power using a piezoelectric generating element, the method comprising:
a step (a) of preparing the piezoelectric generating element, wherein
the piezoelectric generating element includes: a substrate having a vibration part; and a piezoelectric film bonded to the vibration part and having a piezoelectric layer sandwiched between a first electrode and a second electrode,
the first electrode comprises a $Na_xLa_{1-x+y}Ni_{1-y}O_{3-x}$ layer having only an (001) orientation;
the piezoelectric layer is a (1-α) (Bi, Na, Ba) $TiO_3$-α$BiQO_3$ layer having only an (001) orientation;
Q represents Fe, Co, $Zn_{0.5}Ti_{0.5}$, or $Mg_{0.5}Ti_{0.5}$;
x represents a value of not less than 0.01 and not more than 0.05;
y represents a value of not less than 0.05 and not more than 0.20; and
α represents a value of not less than 0.20 and not more than 0.50; and
a step (b) of vibrating the vibration part to obtain electric power through the first electrode and the second electrode.

20. The method according to claim 19, wherein
the (1-α) (Bi, Na, Ba) $TiO_3$-α$BiQO_3$ layer is in contact with the $Na_xLa_{1-x+y}Ni_{1-y}O_{3-x}$ layer.

21. The method according to claim 19, wherein
the (1-α) (Bi, Na, Ba) $TiO_3$-α$BiQO_3$ layer contains Mn.

* * * * *